United States Patent
Kim

(10) Patent No.: US 9,355,753 B2
(45) Date of Patent: *May 31, 2016

(54) CONDUCTIVE LIQUID CRYSTALLINE POLYMER COMPOSITION

(71) Applicant: Ticona LLC, Florence, KY (US)

(72) Inventor: Young Shin Kim, Erlanger, KY (US)

(73) Assignee: Ticona LLC, Florence, KY (US)

( * ) Notice: Subject to any disclaimer, the term of this patent is extended or adjusted under 35 U.S.C. 154(b) by 199 days.

This patent is subject to a terminal disclaimer.

(21) Appl. No.: 14/052,792

(22) Filed: Oct. 14, 2013

(65) Prior Publication Data
US 2014/0151610 A1 Jun. 5, 2014

Related U.S. Application Data

(60) Provisional application No. 61/733,607, filed on Dec. 5, 2012.

(51) Int. Cl.
| | |
|---|---|
| H01B 1/22 | (2006.01) |
| H05K 1/00 | (2006.01) |
| C08K 3/04 | (2006.01) |
| H01B 1/24 | (2006.01) |
| H05K 1/02 | (2006.01) |
| C09K 19/38 | (2006.01) |
| C08K 7/06 | (2006.01) |
| C08K 3/34 | (2006.01) |

(Continued)

(52) U.S. Cl.
CPC ... *H01B 1/24* (2013.01); *C08K 3/346* (2013.01); *C08K 7/06* (2013.01); *C08K 7/14* (2013.01); *C09K 19/3809* (2013.01); *H05K 1/024* (2013.01); C08K 2201/001 (2013.01); C09K 2019/521 (2013.01)

(58) Field of Classification Search
CPC .............. H01B 1/00; H01B 1/20; H01B 1/24; H05K 2201/0141; H05K 1/024; H05K 1/0373; C08K 3/04; B32B 2262/106
See application file for complete search history.

(56) References Cited

U.S. PATENT DOCUMENTS

| | | |
|---|---|---|
| 4,458,039 A | 7/1984 | Eickman |
| 5,352,746 A | 10/1994 | Asai et al. |

(Continued)

FOREIGN PATENT DOCUMENTS

| | | |
|---|---|---|
| EP | 0 312 331 A2 | 4/1989 |
| EP | 0 312 331 A3 | 4/1989 |

(Continued)

OTHER PUBLICATIONS

Young Shin Kim, U.S. Appl. No. 14/052,790, filed Oct. 14, 2013, Antistatic Liquid Crystalline Polymer Composition.

(Continued)

*Primary Examiner* — Mark Kopec
(74) *Attorney, Agent, or Firm* — Dority & Manning, P.A.

(57) ABSTRACT

A liquid crystalline polymer composition that is thermally and/or electrically conductive and has a reduced tendency to create a static electric charge during a molding operation is provided. More particularly, the composition contains carbon fibers distributed within a liquid crystalline polymer matrix. Through the use of carbon fibers having relatively high purity, high temperature sizing agent, and/or various process parameters, molded parts can be produced having excellent characteristics while minimizing the amount of carbon fibers contained within the polymer matrix.

13 Claims, 5 Drawing Sheets

(51) Int. Cl.
*C08K 7/14* (2006.01)
*C09K 19/52* (2006.01)

(56) References Cited

U.S. PATENT DOCUMENTS

| | | | |
|---|---|---|---|
| 5,492,946 A | 2/1996 | Huspeni et al. | |
| 5,508,374 A | 4/1996 | Lee et al. | |
| 5,538,666 A | 7/1996 | Jin | |
| 5,830,940 A | 11/1998 | Nakamura et al. | |
| 5,847,039 A | 12/1998 | Nagashima et al. | |
| 5,928,589 A | 7/1999 | Norota et al. | |
| 5,962,122 A | 10/1999 | Walpita et al. | |
| 5,997,765 A | 12/1999 | Furuta et al. | |
| 6,010,760 A | 1/2000 | Miyazaki et al. | |
| 6,046,300 A | 4/2000 | Umetsu et al. | |
| 6,063,848 A | 5/2000 | Murakami et al. | |
| 6,140,455 A | 10/2000 | Nagashima et al. | |
| 6,153,121 A | 11/2000 | Makabe et al. | |
| 6,379,795 B1 | 4/2002 | Bisaria et al. | |
| 6,492,463 B1 | 12/2002 | Waggoner | |
| 6,495,616 B2 | 12/2002 | Maeda | |
| 6,680,002 B2 | 1/2004 | Yamauchi et al. | |
| 6,702,955 B1 | 3/2004 | Murakami et al. | |
| 6,702,956 B2 | 3/2004 | Maeda et al. | |
| 6,733,691 B2 | 5/2004 | Nagano et al. | |
| 6,755,992 B2 | 6/2004 | Okamoto et al. | |
| 6,758,989 B2 | 7/2004 | Miyashita et al. | |
| 6,797,198 B1 | 9/2004 | Miyashita et al. | |
| 6,833,405 B1 | 12/2004 | Cottis | |
| 6,861,463 B2 | 3/2005 | Cottis | |
| 7,079,405 B2 | 7/2006 | Tobita et al. | |
| 7,166,238 B2 | 1/2007 | Kato et al. | |
| 7,175,779 B1 | 2/2007 | Kricheldorf et al. | |
| 7,189,778 B2 | 3/2007 | Tobita et al. | |
| 7,276,284 B2 | 10/2007 | Frohs | |
| 7,344,657 B2 | 3/2008 | Okamoto et al. | |
| 7,438,832 B2 | 10/2008 | Majumdar et al. | |
| 7,540,991 B2 | 6/2009 | Shimoyama et al. | |
| 7,547,403 B2 | 6/2009 | Miyashita et al. | |
| 7,601,771 B2 | 10/2009 | Schmidt et al. | |
| 7,641,833 B2 | 1/2010 | Aoki et al. | |
| 7,648,748 B2 | 1/2010 | Nakane et al. | |
| 7,704,408 B2 | 4/2010 | Fukatsu | |
| 7,740,770 B2 | 6/2010 | Mizumoto et al. | |
| 7,789,670 B2 | 9/2010 | Fukatsu et al. | |
| 7,824,572 B2 | 11/2010 | Okamoto | |
| 7,825,176 B2 | 11/2010 | Kim et al. | |
| 7,892,450 B2 | 2/2011 | Uchida et al. | |
| 7,931,824 B2 | 4/2011 | Gin et al. | |
| 7,980,897 B2 | 7/2011 | Fukatsu et al. | |
| 7,985,351 B2 | 7/2011 | Yamauchi et al. | |
| 8,029,694 B2 | 10/2011 | Saga | |
| 8,066,907 B2 | 11/2011 | Kohinata et al. | |
| 8,142,683 B2 | 3/2012 | Murouchi et al. | |
| 8,192,645 B2 | 6/2012 | Murouchi et al. | |
| 8,202,448 B2 | 6/2012 | Fukuhara et al. | |
| 8,231,805 B2 | 7/2012 | Fukuhara et al. | |
| 8,272,879 B2 | 9/2012 | Fukatsu et al. | |
| 8,324,307 B2 | 12/2012 | Harder et al. | |
| 8,337,719 B2 | 12/2012 | Hosoda et al. | |
| 8,432,484 B2 | 4/2013 | Christison | |
| 8,440,780 B2 | 5/2013 | Hamaguchi et al. | |
| 8,465,670 B2 | 6/2013 | Kondo et al. | |
| 8,545,719 B2 | 10/2013 | Komatsu et al. | |
| 8,646,994 B2 | 2/2014 | Kim et al. | |
| 8,658,057 B2 | 2/2014 | Nakayama et al. | |
| 8,696,932 B2 | 4/2014 | Uchida et al. | |
| 2002/0064701 A1 | 5/2002 | Hand et al. | |
| 2002/0190432 A1 | 12/2002 | Shiwaku et al. | |
| 2004/0113129 A1* | 6/2004 | Waggoner | C08K 3/04 252/500 |
| 2005/0077498 A1 | 4/2005 | Kato et al. | |
| 2005/0176835 A1 | 8/2005 | Kobayashi et al. | |
| 2005/0191877 A1 | 9/2005 | Huang | |
| 2005/0260361 A1 | 11/2005 | Alms et al. | |
| 2006/0009580 A1 | 1/2006 | Alms et al. | |
| 2006/0014876 A1 | 1/2006 | Bushelman et al. | |
| 2006/0025561 A1 | 2/2006 | Watanabe et al. | |
| 2007/0057236 A1 | 3/2007 | Hosoda et al. | |
| 2007/0190346 A1 | 8/2007 | Ikegawa | |
| 2008/0048150 A1* | 2/2008 | Hosoda | C08K 3/22 252/299.5 |
| 2009/0027586 A1 | 1/2009 | Kumai et al. | |
| 2009/0212684 A1 | 8/2009 | Saito et al. | |
| 2010/0012354 A1 | 1/2010 | Hedin et al. | |
| 2010/0163795 A1* | 7/2010 | Kim | C08K 3/0008 252/299.6 |
| 2011/0171452 A1 | 7/2011 | Öttinger et al. | |
| 2011/0189454 A1 | 8/2011 | Fukuhara et al. | |
| 2012/0135228 A1 | 5/2012 | Fukuhara et al. | |
| 2012/0193571 A1 | 8/2012 | Lee et al. | |
| 2012/0199790 A1 | 8/2012 | Yun et al. | |
| 2013/0015400 A1 | 1/2013 | Matsubara et al. | |
| 2013/0015401 A1 | 1/2013 | Matsubara et al. | |
| 2013/0015411 A1 | 1/2013 | Kang et al. | |
| 2013/0022828 A1 | 1/2013 | Matsubara et al. | |
| 2013/0048909 A1 | 2/2013 | Nair et al. | |
| 2013/0048914 A1 | 2/2013 | Nair et al. | |
| 2013/0052447 A1 | 2/2013 | Grenci et al. | |
| 2013/0062558 A1 | 3/2013 | Nair et al. | |
| 2013/0122272 A1 | 5/2013 | Kim | |
| 2013/0122273 A1 | 5/2013 | Kim | |
| 2013/0122274 A1 | 5/2013 | Kim et al. | |
| 2013/0123420 A1 | 5/2013 | Kim | |
| 2013/0200297 A1 | 8/2013 | Saga | |
| 2013/0231434 A1 | 9/2013 | Lee et al. | |
| 2013/0231436 A1 | 9/2013 | Lee et al. | |
| 2013/0253118 A1 | 9/2013 | Shiraishi et al. | |
| 2014/0105590 A1 | 4/2014 | Kim | |
| 2014/0272365 A1* | 9/2014 | Kim | C08K 3/34 428/220 |

FOREIGN PATENT DOCUMENTS

| | | |
|---|---|---|
| EP | 1 116 769 A2 | 7/2001 |
| EP | 1 116 769 A3 | 7/2001 |
| EP | 1 382 437 A2 | 1/2004 |
| EP | 1 382 437 A3 | 1/2004 |
| EP | 1 699 228 A1 | 9/2006 |
| WO | WO 2006104701 A1 | 10/2006 |
| WO | WO 2006126861 A1 | 11/2006 |
| WO | WO 2009005317 A2 | 1/2009 |
| WO | WO 2009005317 A3 | 1/2009 |
| WO | WO 2013032970 A1 | 3/2013 |
| WO | WO 2013074469 A1 | 5/2013 |
| WO | WO 2013074475 A1 | 5/2013 |

OTHER PUBLICATIONS

Young Shin Kim, U.S. Appl. No. 14/502,797, filed Oct. 14, 2013, Liquid Crystalline Polymer Composition.
Young Shin Kim, U.S. Appl. No. 14/052,800, filed Oct. 14, 2013, Compact Camera Module.
Abstract of Japanese Patent—JPH0481451, Mar. 16, 1992, 1 page.
Abstract of Japanese Patent—JPH05140282, Jun. 8, 1993, 1 page with Machine Translation.
Abstract of Japanese Patent—JPH0718162, Jan. 20, 1995, 1 page.
Abstract of Japanese Patent—JPH09143347, Jun. 3, 1997, 1 page.
Abstract of Japanese Patent—JPH09297256, Nov. 18, 1997, 2 pages.
Abstract of Japanese Patent—JPH1160927, Mar. 5, 1999, 2 pages.
Abstract of Japanese Patent—JPH1180517, Mar. 26, 1999, 1 page.
Abstract of Japanese Patent—JPH1180518, Mar. 26, 1999, 1 page.
Abstract of Japanese Patent—JPH11147999, Jun. 2, 1999, 1 page.
Abstract of Japanese Patent—JP2000080289, Mar. 21, 2000, 1 page.
Abstract of Japanese Patent—JP2000273292, Oct. 3, 2000, 1 page.
Abstract of Japanese Patent—JP2000273320, Oct. 3, 2000, 1 page.
Abstract of Japanese Patent—JP2000281885, Oct. 10, 2000, 2 pages.
Abstract of Japanese Patent—JP2004182895, Jul. 2, 2004, 1 page.
Abstract of Japanese Patent—JP2004182895, Sep. 24, 2004, 1 page.
Abstract of Japanese Patent—JP2005187696, Jul. 14, 2005, 1 page.
Abstract of Japanese Patent—JP2008075079, Apr. 3, 2008, 1 page.
Abstract of Japanese Patent—JP2008214573, Sep. 18, 2008, 1 page.

(56) References Cited

OTHER PUBLICATIONS

Abstract of Japanese Patent—JP2009242454, Oct. 22, 2009, 1 page.
Abstract of Japanese Patent—JP2009242455, Oct. 22, 2009, 1 page.
Abstract of Japanese Patent—JP5172279, Mar. 27, 2013, 1 page with Translation of Claims, 2 pages.
Abstract of Korean Patent—KR20120114048, Oct. 16, 2012, 1 page.
Abstract of Korean Patent—KR20130047456, May 8, 2013, 1 page.
Abstract of WO Patent—WO2005063889, Jul. 14, 2005, 1 page.
Abstract of WO Patent—WO2010013578, Feb. 4, 2010, 1 page and Translation of Claims, 2 pages.
Abstract of WO Patent—WO2012050082, Apr. 19, 2012, 1 page.
Abstract of WO Patent—WO2013066003, May 10, 2013, 1 page.
Abstract of WO Patent—WO2013129338, Sep. 6, 2013, 2 pages.
Article—Liu et al., "Immobilization and melting point depression of imidazolium ionic liquids on the surface of nano-$SiO_x$ particles," *Dalton Trans.*, vol. 39, 2010, pp. 3190-3194.
Product Information—Sigrafil® C, The Carbon Fiber for Thermoplastic Compounds from SGL Group, 2009, 4 pages.
Product Information on Talc from Nippon Talc Co., Ltd., 5 pages.
Search Report and Written Opinion for PCT/US2013/064766, Jan. 27, 2014, 11 pages.

\* cited by examiner

CONDUCTIVE LIQUID CRYSTALLINE POLYMER COMPOSITION

RELATED APPLICATIONS

The present application claims priority to U.S. Provisional Application Ser. No. 61/733,607, filed on Dec. 5, 2012, which is incorporated herein in its entirety by reference thereto.

BACKGROUND OF THE INVENTION

Electrical components often contain molded parts that are formed from liquid crystalline polymers due to their ability to form highly ordered structures. For instance, attempts have been made to use liquid crystalline polymers for the molded parts of a compact camera module ("CCM"), such as the lens barrel or the base on which it is mounted. Unfortunately, various problems are often experienced when attempting to form such molded parts from liquid crystalline polymers. When the part is ejected from the mold, for example, a static electric charge may be created that results in the attachment of dust particles to a surface of the part. In certain products, such as compact camera modules, these dust particles are detrimental and can lead to significant product defects. As such, a need exists for an electrically and/or thermally conductive liquid crystalline polymer composition that has a reduced tendency to create a static electric charge during a molding operation.

SUMMARY OF THE INVENTION

In accordance with one embodiment of the present invention, a molded part is disclosed that comprises a polymer composition. The polymer composition comprises carbon fibers distributed within a liquid crystalline polymer matrix that constitutes from about 25 wt. % to about 95 wt. % of the composition. The molded part exhibits a surface resistivity of about $1 \times 10^{14}$ or less and/or a dielectric constant of about 5 or more.

In accordance with another embodiment of the present invention, a method for forming a liquid crystalline polymer composition within an extruder is disclosed. The extruder contains at least one rotatable screw within a barrel, wherein the screw has a total length and diameter and wherein a feed section and melt section located downstream from the feed section are defined along the length of the screw. The method comprises supplying a liquid crystalline polymer to the feed section of the extruder; supplying carbon fibers to the extruder at a location downstream from the feed section where the liquid crystalline polymer is supplied; and blending the fibers and the liquid crystalline polymer within the extruder to form a liquid crystalline polymer composition.

Other features and aspects of the present invention are set forth in greater detail below.

BRIEF DESCRIPTION OF THE FIGURES

A full and enabling disclosure of the present invention, including the best mode thereof to one skilled in the art, is set forth more particularly in the remainder of the specification, including reference to the accompanying figures, in which.

DETAILED DESCRIPTION

Figure 1:
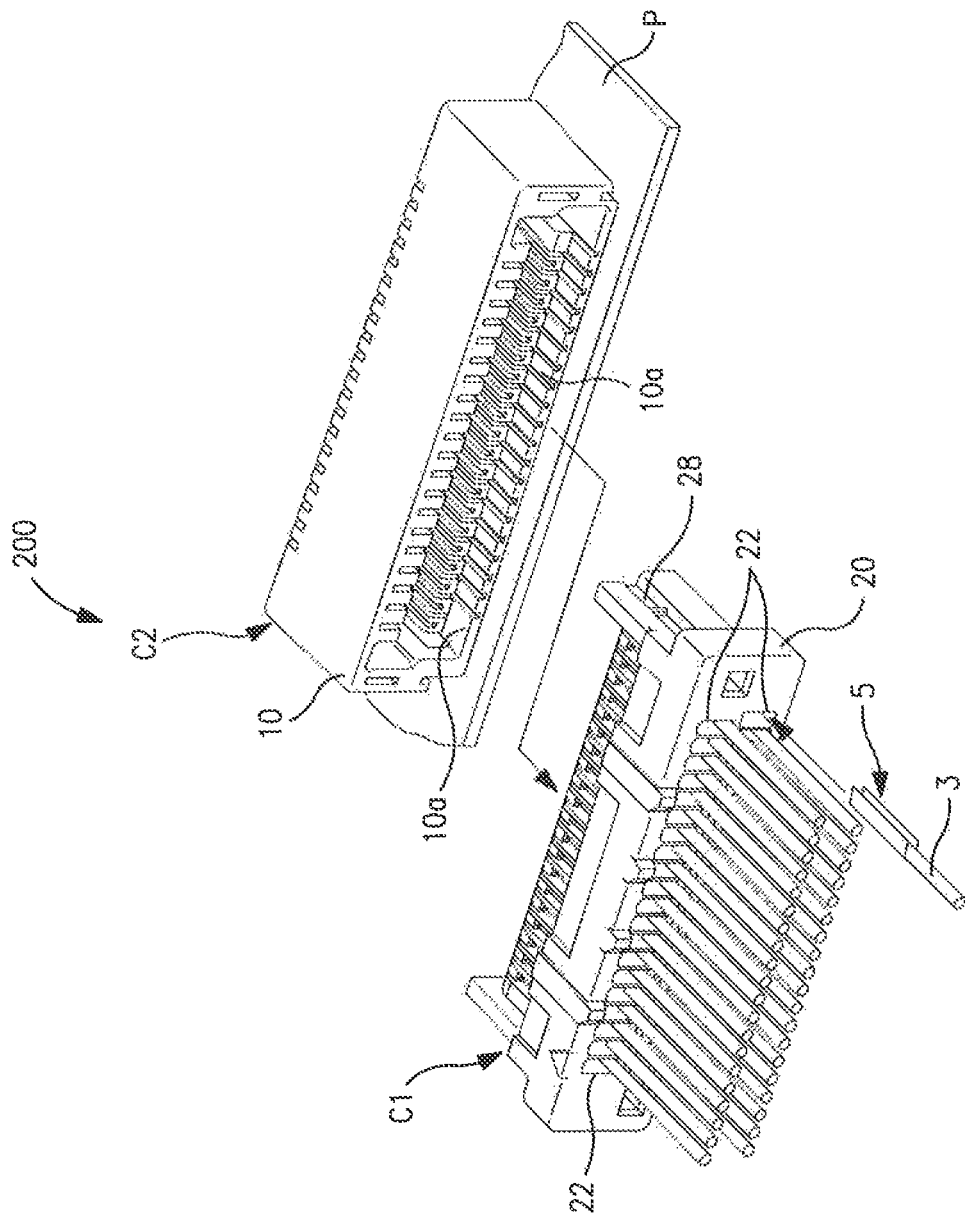
FIG. 1 is an exploded perspective view of one embodiment of a fine pitch electrical connector that may be formed according to the present invention.

It is to be understood by one of ordinary skill in the art that the present discussion is a description of exemplary embodiments only, and is not intended as limiting the broader aspects of the present invention.

Generally speaking, the present invention is directed to a liquid crystalline polymer composition that is thermally and/or electrically conductive and has a reduced tendency to create a static electric charge during a molding operation. More particularly, the composition contains carbon fibers that are distributed within a liquid crystalline polymer matrix. By controlling the process by which the fibers are incorporated into the polymer matrix, by selecting high purity fibers, by selecting fibers having particular dimensions, and/or by selecting fibers having a sizing agent that is polymer and temperature compatible, the present inventor has discovered that the carbon fibers can achieve a better connection and electrical pathway within the liquid crystalline polymer matrix, thereby reducing surface and/or volume resistivity. Among other things, this may enhance the ability of the composition to rapidly dissipate static electric charges from its surface. The antistatic behavior can be characterized by a relatively low surface and/or volume resistivity as determined in accordance with IEC 60093. Namely, a molded part formed from the polymer composition may exhibit a surface resistivity of about $1 \times 10^{14}$ ohms or less, in some embodiments about $1 \times 10^{10}$ ohms or less, in some embodiments from about $1 \times 10^{2}$ ohms to about $1 \times 10^{8}$ ohms, and in some embodiments, from about $1 \times 10^{3}$ to about $1 \times 10^{6}$ ohms. Likewise, the molded part may also exhibit a volume resistivity of about $1 \times 10^{13}$ ohm-m or less, in some embodiments from about $1 \times 10^{2}$ ohm-m to about $9 \times 10^{8}$ ohm-m, and in some embodiments, from about $1 \times 10^{3}$ to about $5 \times 10^{6}$ ohm-m.

In addition, the present inventor has also surprisingly discovered that, despite the presence of conductive carbon fibers, the polymer composition can still possess a relatively high dielectric constant. For example, the dielectric constant of the composition may be about 5 or more, in some embodiments about 10 or more, and in some embodiments, from about 15 to about 100, as determined by the split post resonator method at a frequency of 10 MHz. Even at such high dielectric constants, the dissipation factor, a measure of the loss rate of energy, may remain relatively low. For example, the dissipation factor, may be about 1 or less, in some embodiments about 0.5 or less, and in some embodiments, from about 0.001 to about 0.3, as determined by the split post resonator method at a frequency of 10 MHz.

Various embodiments of the present invention will now be described in more detail.

I. Liquid Crystalline Polymer

The thermotropic liquid crystalline polymer generally has a high degree of crystallinity that enables it to effectively fill the small spaces of a mold. Suitable thermotropic liquid crystalline polymers may include aromatic polyesters, aromatic poly(esteramides), aromatic poly(estercarbonates), aromatic polyamides, etc., and may likewise contain repeating units formed from one or more aromatic hydroxycarboxylic acids, aromatic dicarboxylic acids, aromatic diols, aromatic aminocarboxylic acids, aromatic amines, aromatic diamines, etc., as well as combinations thereof.

Liquid crystalline polymers are generally classified as "thermotropic" to the extent that they can possess a rod-like structure and exhibit a crystalline behavior in its molten state (e.g., thermotropic nematic state). Such polymers may be formed from one or more types of repeating units as is known in the art. The liquid crystalline polymer may, for example, contain one or more aromatic ester repeating units, typically in an amount of from about 60 mol. % to about 99.9 mol. %, in some embodiments from about 70 mol. % to about 99.5 mol. %, and in some embodiments, from about 80 mol. % to about 99 mol. % of the polymer. The aromatic ester repeating units may be generally represented by the following Formula (I):

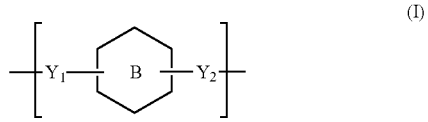

wherein, ring B is a substituted or unsubstituted 6-membered aryl group (e.g., 1,4-phenylene or 1,3-phenylene), a substituted or unsubstituted 6-membered aryl group fused to a substituted or unsubstituted 5- or 6-membered aryl group (e.g., 2,6-naphthalene), or a substituted or unsubstituted 6-membered aryl group linked to a substituted or unsubstituted 5- or 6-membered aryl group (e.g., 4,4-biphenylene); and $Y_1$ and $Y_2$ are independently O, C(O), NH, C(O)HN, or NHC(O).

Typically, at least one of $Y_1$ and $Y_2$ are C(O). Examples of such aromatic ester repeating units may include, for instance, aromatic dicarboxylic repeating units ($Y_1$ and $Y_2$ in Formula I are C(O)), aromatic hydroxycarboxylic repeating units ($Y_1$ is O and $Y_2$ is C(O) in Formula I), as well as various combinations thereof.

Aromatic dicarboxylic repeating units, for instance, may be employed that are derived from aromatic dicarboxylic acids, such as terephthalic acid, isophthalic acid, 2,6-naphthalenedicarboxylic acid, diphenyl ether-4,4'-dicarboxylic acid, 1,6-naphthalenedicarboxylic acid, 2,7-naphthalenedicarboxylic acid, 4,4'-dicarboxybiphenyl, bis(4-carboxyphenyl)ether, bis(4-carboxyphenyl)butane, bis(4-carboxyphenyl)ethane, bis(3-carboxyphenyl)ether, bis(3-carboxyphenyl)ethane, etc., as well as alkyl, alkoxy, aryl and halogen substituents thereof, and combinations thereof. Particularly suitable aromatic dicarboxylic acids may include, for instance, terephthalic acid ("TA"), isophthalic acid ("IA"), and 2,6-naphthalenedicarboxylic acid ("NDA"). When employed, repeating units derived from aromatic dicarboxylic acids (e.g., IA, TA, and/or NDA) typically constitute from about 5 mol. % to about 60 mol. %, in some embodiments from about 10 mol. % to about 55 mol. %, and in some embodiments, from about 15 mol. % to about 50 mol. % of the polymer.

Aromatic hydroxycarboxylic repeating units may also be employed that are derived from aromatic hydroxycarboxylic acids, such as, 4-hydroxybenzoic acid; 4-hydroxy-4'-biphenylcarboxylic acid; 2-hydroxy-6-naphthoic acid; 2-hydroxy-5-naphthoic acid; 3-hydroxy-2-naphthoic acid; 2-hydroxy-3-naphthoic acid; 4'-hydroxyphenyl-4-benzoic acid; 3'-hydroxyphenyl-4-benzoic acid; 4'-hydroxyphenyl-3-benzoic acid, etc., as well as alkyl, alkoxy, aryl and halogen substituents thereof, and combination thereof. Particularly suitable aromatic hydroxycarboxylic acids are 4-hydroxybenzoic acid ('HBA') and 6-hydroxy-2-naphthoic acid ("HNA"). When employed, repeating units derived from hydroxycarboxylic acids (e.g., HBA and/or HNA) typically constitute from about 10 mol. % to about 85 mol. %, in some embodiments from about 20 mol. % to about 80 mol. %, and in some embodiments, from about 25 mol. % to about 75 mol. % of the polymer.

Other repeating units may also be employed in the polymer. In certain embodiments, for instance, repeating units may be employed that are derived from aromatic diols, such as hydroquinone, resorcinol, 2,6-dihydroxynaphthalene, 2,7-dihydroxynaphthalene, 1,6-dihydroxynaphthalene, 4,4'-dihydroxybiphenyl (or 4,4'-biphenol), 3,3'-dihydroxybiphenyl, 3,4'-dihydroxybiphenyl, 4,4'-dihydroxybiphenyl ether, bis(4-hydroxyphenyl)ethane, etc., as well as alkyl, alkoxy, aryl and halogen substituents thereof, and combinations thereof. Particularly suitable aromatic diols may include, for instance, hydroquinone ("HQ") and 4,4'-biphenol ("BP"). When employed, repeating units derived from aromatic diols (e.g., HQ and/or BP) typically constitute from about 1 mol. % to about 30 mol. %, in some embodiments from about 2 mol. % to about 25 mol. %, and in some embodiments, from about 5 mol. % to about 20% of the polymer. Repeating units may also be employed, such as those derived from aromatic amides (e.g., acetaminophen ("APAP")) and/or aromatic amines (e.g., aminophenol ("AP"), 3-aminophenol, 1,4-phenylenediamine, phenylenediamine, etc.). When employed, repeating units derived from aromatic amides (e.g., APAP) and/or aromatic amines (e.g., AP) typically constitute from about 0.1 mol. % to about 20 mol. %, in some embodiments from about 0.5 mol. % to about 15 mol. %, and in some embodiments, from about 1 mol. % to about 10 mol. % of the polymer. It should also be understood that various other monomeric repeating units may be incorporated into the polymer. For instance, in certain embodiments, the polymer may contain one or more repeating units derived from non-aromatic monomers, such as aliphatic or cycloaliphatic hydroxycarboxylic acids, dicarboxylic acids, dials, amides, amines, etc. Of course, in other embodiments, the polymer may be "wholly aromatic" in that it lacks repeating units derived from non-aromatic (e.g., aliphatic or cycloaliphatic) monomers.

Although not necessarily required, the liquid crystalline polymer may be a "low naphthenic" polymer to the extent that it contains a minimal content of repeating units derived from naphthenic hydroxycarboxylic acids and naphthenic dicarboxylic acids, such as naphthalene-2,6-dicarboxylic acid ("NDA"), 6-hydroxy-2-naphthoic acid ("HNA"), or combinations thereof. That is, the total amount of repeating units derived from naphthenic hydroxycarboxylic and/or dicarboxylic acids (e.g., NDA, HNA, or a combination of HNA and NDA) is typically no more than 30 mol. %, in some embodiments no more than about 15 mol. %, in some embodiments no more than about 10 mol. %, in some embodiments no more than about 8 mol. %, and in some embodiments, from 0 mol. % to about 5 mol. % of the polymer (e.g., 0 mol. %). Despite the absence of a high level of conventional naphthenic acids, it is believed that the resulting "low naphthenic" polymers are still capable of exhibiting good thermal and mechanical properties.

In one particular embodiment, the liquid crystalline polymer may be formed from repeating units derived from 4-hydroxybenzoic acid ('HBA') and terephthalic acid ("TA") and/or isophthalic acid ("IA"), as well as various other optional constituents. The repeating units derived from 4-hydroxybenzoic acid ('HBA') may constitute from about 10 mol. % to about 80 mol. %, in some embodiments from about 30 mol. % to about 75 mol. %, and in some embodiments, from about 45 mol. % to about 70 mol. % of the polymer. The repeating units derived from terephthalic acid ("TA") and/or isophthalic acid ("IA") may likewise constitute from about 5 mol. % to about 40 mol. %, in some embodiments from about 10 mol. % to about 35 mol. %, and in some embodiments, from about 15 mol. % to about 35 mol. % of the polymer. Repeating units may also be employed that are derived from 4,4'-biphenol ("BP") and/or hydroquinone ("HQ") in an amount from about 1 mol. % to about 30 mol. %, in some embodiments from about 2 mol. % to about 25 mol. %, and in some embodiments, from about 5 mol. % to about 20 mol. % of the polymer. Other possible repeating units may include those derived from 6-hydroxy-2-naphthoic acid ("HNA"), 2,6-naphthalenedicarboxylic acid ("NDA"), and/or acetaminophen ("APAP"). In certain embodiments, for example, repeating units derived from HNA, NDA, and/or APAP may each constitute from about 1 mol. % to about 35 mol. %, in some embodiments from about 2 mol. % to about 30 mol. %, and in some embodiments, from about 3 mol. % to about 25 mol. % when employed.

Regardless of the particular constituents and nature of the polymer, the liquid crystalline polymer may be prepared by initially introducing the aromatic monomer(s) used to form ester repeating units (e.g., aromatic hydroxycarboxylic acid, aromatic dicarboxylic acid, etc.) and/or other repeating units (e.g., aromatic diol, aromatic amide, aromatic amine, etc.) into a reactor vessel to initiate a polycondensation reaction. The particular conditions and steps employed in such reactions are well known, and may be described in more detail in U.S. Pat. No. 4,161,470 to Calundann; U.S. Pat. No. 5,616,680 to Linstid, III et al.; U.S. Pat. No. 6,114,492 to Linstid. III et al.; U.S. Pat. No. 6,514,611 to Shepherd, et al.; and WO 2004/058851 to Waggoner. The vessel employed for the reaction is not especially limited, although it is typically desired to employ one that is commonly used in reactions of high viscosity fluids. Examples of such a reaction vessel may include a stirring tank-type apparatus that has an agitator with a variably-shaped stirring blade, such as an anchor type, multistage type, spiral-ribbon type, screw shaft type, etc., or a modified shape thereof. Further examples of such a reaction vessel may include a mixing apparatus commonly used in resin kneading, such as a kneader, a roll mill, a Banbury mixer, etc.

If desired, the reaction may proceed through the acetylation of the monomers as known the art. This may be accomplished by adding an acetylating agent (e.g., acetic anhydride) to the monomers. Acetylation is generally initiated at temperatures of about 90° C. During the initial stage of the acetylation, reflux may be employed to maintain vapor phase temperature below the point at which acetic acid byproduct and anhydride begin to distill. Temperatures during acetylation typically range from between 90° C. to 150° C., and in some embodiments, from about 110° C. to about 150° C. If reflux is used, the vapor phase temperature typically exceeds the boiling point of acetic acid, but remains low enough to retain residual acetic anhydride. For example, acetic anhydride vaporizes at temperatures of about 140° C. Thus, providing the reactor with a vapor phase reflux at a temperature of from about 110° C. to about 130° C. is particularly desirable. To ensure substantially complete reaction, an excess amount of acetic anhydride may be employed. The amount of excess anhydride will vary depending upon the particular acetylation conditions employed, including the presence or absence of reflux. The use of an excess of from about 1 to about 10 mole percent of acetic anhydride, based on the total moles of reactant hydroxyl groups present is not uncommon.

Acetylation may occur in a separate reactor vessel, or it may occur in situ within the polymerization reactor vessel. When separate reactor vessels are employed, one or more of the monomers may be introduced to the acetylation reactor and subsequently transferred to the polymerization reactor. Likewise, one or more of the monomers may also be directly introduced to the reactor vessel without undergoing pre-acetylation.

In addition to the monomers and optional acetylating agents, other components may also be included within the reaction mixture to help facilitate polymerization. For instance, a catalyst may be optionally employed, such as metal salt catalysts (e.g., magnesium acetate, tin(I) acetate, tetrabutyl titanate, lead acetate, sodium acetate, potassium acetate, etc.) and organic compound catalysts (e.g., N-methylimidazole). Such catalysts are typically used in amounts of from about 50 to about 500 parts per million based on the total weight of the recurring unit precursors. When separate reactors are employed, it is typically desired to apply the catalyst to the acetylation reactor rather than the polymerization reactor, although this is by no means a requirement.

The reaction mixture is generally heated to an elevated temperature within the polymerization reactor vessel to initiate melt polycondensation of the reactants. Polycondensation may occur, for instance, within a temperature range of from about 250° C. to about 400° C., in some embodiments from about 280° C. to about 395° C., and in some embodiments, from about 300° C. to about 380° C. For instance, one suitable technique for forming the liquid crystalline polymer may include charging precursor monomers and acetic anhydride into the reactor, heating the mixture to a temperature of from about 90° C. to about 150° C. to acetylize a hydroxyl group of the monomers (e.g., forming acetoxy), and then increasing the temperature to from about 250° C. to about 400° C. to carry out melt polycondensation. As the final polymerization temperatures are approached, volatile byproducts of the reaction (e.g., acetic acid) may also be removed so that the desired molecular weight may be readily achieved. The reaction mixture is generally subjected to agitation during polymerization to ensure good heat and mass transfer, and in turn, good material homogeneity. The rotational velocity of the agitator may vary during the course of the reaction, but typically ranges from about 10 to about 100 revolutions per minute ("rpm"), and in some embodiments, from about 20 to about 80 rpm. To build molecular weight in the melt, the polymerization reaction may also be conducted under vacuum, the application of which facilitates the removal of volatiles formed during the final stages of polycondensation. The vacuum may be created by the application of a suctional pressure, such as within the range of from about 5 to about 30 pounds per square inch ("psi"), and in some embodiments, from about 10 to about 20 psi.

Following melt polymerization, the molten polymer may be discharged from the reactor, typically through an extrusion orifice fitted with a die of desired configuration, cooled, and collected. Commonly, the melt is discharged through a perforated die to form strands that are taken up in a water bath, pelletized and dried. In some embodiments, the melt polymerized polymer may also be subjected to a subsequent solid-state polymerization method to further increase its molecular weight. Solid-state polymerization may be conducted in the presence of a gas (e.g., air, inert gas, etc.). Suitable inert gases may include, for instance, include nitrogen, helium, argon, neon, krypton, xenon, etc., as well as combinations thereof. The solid-state polymerization reactor vessel can be of virtually any design that will allow the polymer to be maintained at the desired solid-state polymerization temperature for the desired residence time. Examples of such vessels can be those that have a fixed bed, static bed, moving bed, fluidized bed, etc. The temperature at which solid-state polymerization is performed may vary, but is typically within a range of from about 250° C. to about 350° C. The polymerization time will of course vary based on the temperature and target molecular weight. In most cases, however, the solid-state polymerization time will be from about 2 to about 12 hours, and in some embodiments, from about 4 to about 10 hours.

II. Carbon Fibers

Any of a variety of carbon fibers may generally be employed in the polymer composition, such as pitch-based carbon (e.g., tar pitch), polyacrylonitrile-based carbon, metal-coated carbon, etc. Desirably, the carbon fibers have a high purity in that they possess a relatively high carbon content, such as a carbon content of about 85 wt. % or more, in some embodiments about 90 wt. % or more, and in some embodiments, about 93 wt. % or more. For instance, the carbon content can be at least about 94% wt., such as at least about 95% wt., such as at least about 96% wt., such as at least about 97% wt., such as even at least about 98% wt. The carbon purity is generally less than 100 wt. %, such as less than about 99 wt. %. The density of the carbon fibers is typically from about 0.5 to about 3.0 g/cm$^3$, in some embodiments from about 1.0 to about 2.5 g/cm$^3$, and in some embodiments, from about 1.5 to about 2.0 g/cm$^3$.

In one embodiment, the carbon fibers are incorporated into the matrix with minimal fiber breakage. The volume average length of the fibers after molding can generally be from about 0.1 mm to about 1 mm even when using a fiber having an initial length of about 3 mm. The average length and distribution of the carbon fibers can also be selectively controlled in the final polymer composition to achieve a better connection and electrical pathway within the liquid crystalline polymer matrix.

The average diameter of the fibers can be from about 0.5 to about 30 micrometers, in some embodiments from about 1 to about 20 micrometers, and in some embodiments, from about 3 to about 15 micrometers.

In order to improve dispersion within the polymer matrix, in one embodiment, the carbon fibers can be at least partially coated with a sizing agent. A sizing agent, for instance, can be selected that increases the compatibility of the carbon fibers with the liquid crystalline polymer. For instance, in one embodiment, the sizing agent may make the fibers more wettable with the molten polymer. The sizing agent should also be thermally stable such that the sizing agent does not thermally degrade at temperatures at which the liquid crystalline polymer is molded.

In one embodiment, the sizing agent may comprise a polymer, such as an aromatic polymer. The aromatic polymer selected as the sizing agent may also be thermally stable. For instance, the aromatic polymer may have a thermal decomposition temperature of greater than about 300° C., such as greater than about 350° C., such as greater than about 400° C. Thermal decomposition is a process whereby the action of heat on a material causes a loss of mass. During thermal decomposition, a material generates gaseous vapors and thus loses mass. In order to determine the thermal decomposition temperature of a polymer, thermogravimeteric analysis (TGA) is conducted. In TGA experiments, the sample is brought quickly up to the desired temperature and the weight of the sample is monitored during the course of thermal decomposition. As used herein, the thermal decomposition temperature of a material is the temperature at which the material losses 5% of its mass during thermogravimeteric analysis. One standardized test for thermogravimeteric analysis is ASTM Test E 1131. Another test is ISO Test 11358.

The sizing agent can also have a relatively high glass transition temperature. For instance, the glass transition temperature of the sizing agent can be greater than about 300° C., such as greater than about 350° C., such as greater than about 400° C. The thermal decomposition temperature of the sizing agent and the glass transition temperature of the sizing agent can generally be less than about 800° C., such as less than about 700° C., such as less than about 600° C., such as less than about 500° C.

Particular examples of polymer sizing agents include polyimide polymers, aromatic polyester polymers including wholly aromatic polyester polymers, and high temperature epoxy polymers. In one embodiment, the sizing agent may comprise a liquid crystalline polymer.

The sizing agent can be present on the fibers in an amount of at least about 0.1% wt., such as in an amount of at least 0.2% wt., such as in an amount of at least about 0.1% wt. The sizing agent is generally present in an amount less than about 5% wt., such as in an amount of less than about 3% wt.

Due to the ability of the carbon fibers to achieve a better electrical connection within the liquid crystalline polymer matrix, relatively low concentrations of the carbon fibers can be employed to achieve the desired properties. Because it is employed in relatively low concentrations, however, the thermal and mechanical properties of the composition are not adversely impacted. In this regard, carbon fibers typically constitute from about 0.5 wt. % to about 20 wt. %, in some embodiments from about 1 wt. % to about 15 wt. %, and in some embodiments, from about 4 wt. % to about 12 wt. % of the polymer composition. While the concentration of the liquid crystalline polymers may generally vary based on the presence of other optional components, they are typically present in an amount of from about 25 wt. % to about 95 wt. %, in some embodiments from about 30 wt. % to about 80 wt. %, and in some embodiments, from about 40 wt. % to about 70 wt. %.

III. Optional Components

A. Conductive Fillers

In addition to carbon fibers, other conductive fillers may also be employed in the polymer composition to help improve its antistatic characteristics. Examples of suitable conductive fillers may include, for instance, metal particles (e.g., aluminum flakes), metal fibers, carbon particles (e.g., graphite, expanded graphite, grapheme, carbon black, graphitized carbon black, etc.), carbon nanotubes, and so forth.

B. Fibrous Fillers

Fibrous fillers, which are not generally conductive, may also be employed in the polymer composition to help improve strength. Examples of such fibrous fillers may include those formed from glass, ceramics (e.g., alumina or silica), aramids (e.g., Kevlar® marketed by E.I. DuPont de Nemours, Wilmington, Del.), polyolefins, polyesters, etc., as well as mixtures thereof. Glass fibers are particularly suitable, such as E-glass, A-glass, C-glass, D-glass, AR-glass, R-glass, S1-glass, S2-glass, etc., and mixtures thereof. When employed, the volume average length of the fibers may be from about 50 to about 400 micrometers, in some embodiments from about 80 to about 250 micrometers, in some embodiments from about 100 to about 200 micrometers, and in some embodiments, from about 110 to about 180 micrometers. The fibers may also have a relatively high aspect ratio (average length divided by nominal diameter) to help improve the mechanical properties of the resulting polymer composition. For example, the fibers may have an aspect ratio of from about 2 to about 50, in some embodiments from about 4 to about 40, and in some embodiments, from about 5 to about 20 are particularly beneficial. The fibers may, for example, have a nominal diameter of about 10 to about 35 micrometers, and in some embodiments, from about 15 to about 30 micrometers. The relative amount of the fibrous filler in the polymer composition may also be selectively controlled to help achieve the desired mechanical properties without adversely impacting other properties of the composition, such as its flowability. For example, fibrous fillers typically constitute from about 2 wt. % to about 40 wt. %, in some embodiments from about 5 wt. % to about 35 wt. %, and in some embodiments, from about 10 wt. % to about 30 wt. % of the polymer composition.

C. Particulate Fillers

Particulate fillers, which are not generally conductive, may also be employed in the polymer composition to help achieve the desired properties and/or color. When employed, such particulate fillers typically constitute from about 5% by weight to about 40% by weight, in some embodiments from about 10% by weight to about 35% by weight, and in some embodiments, from about 10% by weight to about 30% by weight of the polymer composition. Clay minerals may be particularly suitable for use in the present invention. Examples of such clay minerals include, for instance, talc ($Mg_3Si_4O_{10}(OH)_2$), halloysite ($Al_2Si_2O_5(OH)_4$), kaolinite ($Al_2Si_2O_5(OH)_4$), illite (($K,H_3O)(Al,Mg,Fe)_2$ $(Si,Al)_4O_{10}$ $[(OH)_2,(H_2O)]$), montmorillonite ($(Na,Ca)_{0.33}(Al,Mg)_2$ $Si_4O_{10}(OH)_2 \cdot nH_2O$), vermiculite (($MgFe,Al)_3(Al,Si)_4O_{10}$ $(OH)_2 \cdot 4H_2O$), palygorskite (($Mg,Al)_2Si_4O_{10}(OH) \cdot 4(H_2O)$), pyrophyllite ($Al_2Si_4O_{10}(OH)_2$), etc., as well as combinations thereof. In lieu of, or in addition to, clay minerals, still other particulate fillers may also be employed. For example, other suitable silicate fillers may also be employed, such as calcium silicate, aluminum silicate, mica, diatomaceous earth, wollastonite, and so forth. Mica, for instance, may be a particularly suitable mineral for use in the present invention. There are several chemically distinct mica species with considerable variance in geologic occurrence, but all have essentially the same crystal structure. As used herein, the term "mica" is meant to generically include any of these species, such as muscovite ($KAl_2(AlSi_3)O_{10}(OH)_2$), biotite ($K(Mg,Fe)_3$ $(AlSi_3)O_{10}(OH)_2$), phlogopite ($KMg_3(AlSi_3)O_{10}(OH)_2$), lepidolite ($K(Li,Al)_{2-3}(AlSi_3)O_{10}(OH)_2$), glauconite ($(K,Na)$ $(Al,Mg,Fe)_2(Si,Al)_4O_{10}(OH)_2$), etc., as well as combinations thereof.

D. Functional Compounds

If desired, functional compounds may also be employed in the present invention to, among other things, help reduce the melt viscosity of the polymer composition. In one embodiment, for example, the polymer composition of the present invention may contain a functional aromatic compound. Such compounds typically contain one or more carboxyl and/or hydroxyl functional groups that can react with the polymer chain to shorten its length, thus reducing the melt viscosity. In certain cases, the compound may also be able to combine smaller chains of the polymer together after they have been cut to help maintain the mechanical properties of the composition even after its melt viscosity has been reduced. The functional aromatic compound may have the general structure provided below in Formula (II):

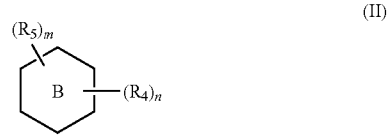

or a metal salt thereof, wherein, ring B is a 6-membered aromatic ring wherein 1 to 3 ring carbon atoms are optionally replaced by nitrogen or oxygen, wherein each nitrogen is optionally oxidized, and wherein ring B may be optionally fused or linked to a 5- or 6-membered aryl, heteroaryl, cycloalkyl, or heterocyclyl;

$R_4$ is OH or COOH;

$R_5$ is acyl, acyloxy (e.g., acetyloxy), acylamino (e.g., acetylamino), alkoxy, alkenyl, alkyl, amino, aryl, aryloxy, carboxyl, carboxyl ester, cycloalkyl, cycloalkyloxy, hydroxyl, halo, haloalkyl, heteroaryl, heteroaryloxy, heterocyclyl, or heterocycloxy;

m is from 0 to 4, in some embodiments from 0 to 2, and in some embodiments, from 0 to 1; and n is from 1 to 3, and in some embodiments, from 1 to 2. When the compound is in the form of a metal salt, suitable metal counterions may include transition metal counterions (e.g., copper, iron, etc.), alkali metal counterions (e.g., potassium, sodium, etc.), alkaline earth metal counterions (e.g., calcium, magnesium, etc.), and/or main group metal counterions (e.g., aluminum).

In one embodiment, for example, B is phenyl in Formula (II) such that the resulting phenolic compounds have the following general formula (III):

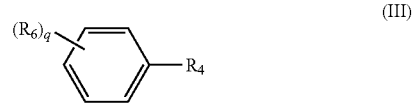

or a metal salt thereof, wherein, $R_4$ is OH or COOH;

$R_6$ is acyl, acyloxy, acylamino, alkoxy, alkenyl, alkyl, amino, carboxyl, carboxyl ester, hydroxyl, halo, or haloalkyl; and q is from 0 to 4, in some embodiments from 0 to 2, and in some embodiments, from 0 to 1. Particular examples of such phenolic compounds include, for instance, benzoic acid (q is 0); 4-hydroxybenzoic acid ($R_4$ is COOH, $R_6$ is OH, and q is 1); phthalic acid ($R_4$ is COOH, $R_6$ is COOH, and q is 1); isophthalic acid ($R_4$ is COOH, $R_6$ is COOH, and q is 1); terephthalic acid ($R_4$ is COOH, $R_6$ is COOH, and q is 1); 2-methylterephthalic acid ($R_4$ is COOH, $R_6$ is COOH, and $CH_3$ and q is 2); phenol ($R_4$ is OH and q is 0); sodium phenoxide ($R_4$ is OH and q is 0); hydroquinone ($R_4$ is OH, $R_6$ is OH, and q is 1); resorcinol ($R_4$ is OH, $R_6$ is OH, and q is 1); 4-hydroxybenzoic acid ($R_4$ is OH, $R_6$ is C(O)OH, and q is 1), etc., as well as combinations thereof.

In another embodiment, B is phenyl and $R_5$ is phenyl in Formula (II) above such that the diphenolic compounds have the following general formula (IV):

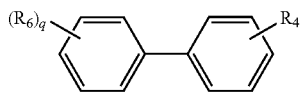

(IV)

or a metal salt thereof, wherein, $R_4$ is COOH or OH;

$R_6$ is acyl, acyloxy, acylamino, alkoxy, alkenyl, alkyl, amino, aryl, aryloxy, carboxyl, carboxyl ester, cycloalkyl, cycloalkyloxy, hydroxyl, halo, haloalkyl, heteroaryl, heteroaryloxy, heterocyclyl, or heterocycloxy; and q is from 0 to 4, in some embodiments from 0 to 2, and in some embodiments, from 0 to 1. Particular examples of such diphenolic compounds include, for instance, 4-hydroxy-4'-biphenylcarboxylic acid ($R_4$ is COOH, $R_6$ is OH, and q is 1); 4'-hydroxyphenyl-4-benzoic acid ($R_4$ is COOH, $R_6$ is OH, and q is 1); 3'-hydroxyphenyl-4-benzoic acid ($R_4$ is COOH, $R_6$ is OH, and q is 1); 4'-hydroxyphenyl-3-benzoic acid ($R_4$ is COOH, $R_6$ is OH, and q is 1); 4,4'-bibenzoic acid ($R_4$ is COOH, $R_6$ is COOH, and q is 1); ($R_4$ is OH, $R_6$ is OH, and q is 1); 3,3'-biphenol ($R_4$ is OH, $R_6$ is OH, and q is 1); 3,4'-biphenol ($R_4$ is OH, $R_6$ is OH, and q is 1); 4-phenylphenol ($R_4$ is OH and q is 0); bis(4-hydroxyphenyl)ethane ($R_4$ is OH, $R_6$ is $C_2(OH)_2$phenol, and q is 1); tris(4-hydroxyphenyl)ethane ($R_4$ is OH, $R_6$ is $C(CH_3)$biphenyl, and q is 1); 4-hydroxy-4'-biphenylcarboxylic acid ($R_4$ is OH, $R_6$ is COOH, and q is 1); 4'-hydroxyphenyl-4-benzoic acid ($R_4$ is OH, $R_6$ is COOH, and q is 1); 3'-hydroxyphenyl-4-benzoic acid ($R_4$ is OH, $R_6$ is COOH, and q is 1); 4'-hydroxyphenyl-3-benzoic acid ($R_4$ is OH, $R_6$ is COOH, and q is 1); etc., as well as combinations thereof.

In yet another embodiment, B is naphthenyl in Formula (II) above such that the resulting naphthenic compounds have the following general formula (V):

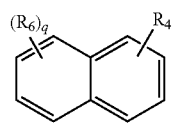

(V)

or a metal salt thereof, wherein, $R_4$ is OH or COOK $R_6$ is acyl, acyloxy, acylamino, alkoxy, alkenyl, alkyl, amino, aryl, aryloxy, carboxyl, carboxyl ester, cycloalkyl, cycloalkyloxy, hydroxyl, halo, haloalkyl, heteroaryl, heteroaryloxy, heterocyclyl, or heterocycloxy; and q is from 0 to 4, in some embodiments from 0 to 2, and in some embodiments, from 0 to 1. Particular examples of such naphthenic compounds include, for instance, 1-naphthoic acid ($R_4$ is COOH and q is 0); 2-naphthoic acid ($R_4$ is COOH and q is 0); 2-hydroxy-6-naphthoic acid ($R_4$ is COOH, $R_6$ is OH, and q is 1); 2-hydroxy-5-naphthoic acid ($R_4$ is COOH, $R_6$ is OH, and q is 1); 3-hydroxy-2-naphthoic acid ($R_4$ is COOH, $R_6$ is OH, and q is 1); 2-hydroxy-3-naphthoic acid ($R_4$ is COOH, $R_6$ is OH, and q is 1); 2,6-naphthalenedicarboxylic acid ($R_4$ is COOH, $R_6$ is COOH, and q is 1); 2,3-naphthalenedicarboxylic acid ($R_4$ is COOH, $R_6$ is COOH, and q is 1); 2-hydroxy-naphthelene ($R_4$ is OH and q is 0); 2-hydroxy-6-naphthoic acid ($R_4$ is OH, $R_6$ is COOH, and q is 1); 2-hydroxy-5-naphthoic acid ($R_4$ is OH, $R_6$ is COOH, and q is 1); 3-hydroxy-2-naphthoic acid ($R_4$ is OH, $R_6$ is COOH, and q is 1); 2-hydroxy-3-naphthoic acid ($R_4$ is OH, $R_6$ is COOH, and q is 1); 2,6-dihydroxynaphthalene ($R_4$ is OH, $R_6$ is OH, and q is 1); 2,7-dihydroxynaphthalene ($R_4$ is OH, $R_6$ is OH, and q is 1); 1,6-dihydroxynaphthalene ($R_4$ is OH, $R_6$ is OH, and q is 1); etc., as well as combinations thereof.

In certain embodiments of the present invention, for example, the polymer composition may contain an aromatic diol, such as hydroquinone, resorcinol, 4,4'-biphenol, etc., as well as combinations thereof. When employed, such aromatic diols may constitute from about 0.01 wt. % to about 1 wt. %, and in some embodiments, from about 0.05 wt. % to about 0.4 wt. % of the polymer composition. An aromatic carboxylic acid may also be employed in certain embodiments, either alone or in conjunction with the aromatic diol. Aromatic carboxylic acids may constitute from about 0.001 wt. % to about 0.5 wt. %, and in some embodiments, from about 0.005 wt. % to about 0.1 wt. % of the polymer composition. In particular embodiments, a combination of an aromatic diol ($R_4$ and $R_6$ are OH in the formulae above) (e.g., 4,4'-biphenol) and an aromatic dicarboxylic acid ($R_4$ and $R_6$ are COOH in the formulae above) (e.g., 2,6-naphthelene dicarboxylic acid) is employed in the present invention to help achieve the desired viscosity reduction.

In addition to those noted above, non-aromatic functional compounds may also be employed in the present invention. Such compounds may serve a variety of purposes, such as reducing melt viscosity. One such non-aromatic functional compound is water. If desired, water can be added in a form that under process conditions generates water. For example, the water can be added as a hydrate that under the process conditions (e.g., high temperature) effectively "loses" water. Such hydrates include alumina trihydrate, copper sulfate pentahydrate, barium chloride dihydrate, calcium sulfate dehydrate, etc., as well as combinations thereof. When employed, the hydrates may constitute from about 0.02 wt. % to about 2 wt. %, and in some embodiments, from about 0.05 wt. % to about 1 wt. % of the polymer composition. In one particular embodiment, a mixture of an aromatic diol, hydrate, and aromatic dicarboxylic acid are employed in the composition. In such embodiments, the weight ratio of hydrates to aromatic diols is typically from about 0.5 to about 8, in some embodiments from about 0.8 to about 5, and in some embodiments, from about 1 to about 5.

E. Other Additives

Still other additives that can be included in the composition may include, for instance, antimicrobials, pigments, antioxidants, stabilizers, surfactants, waxes, solid solvents, flame retardants, anti-drip additives, and other materials added to enhance properties and processability. Lubricants may also be employed in the polymer composition that are capable of withstanding the processing conditions of the liquid crystalline polymer without substantial decomposition. Examples of such lubricants include fatty acids esters, the salts thereof, esters, fatty acid amides, organic phosphate esters, and hydrocarbon waxes of the type commonly used as lubricants in the processing of engineering plastic materials, including mixtures thereof. Suitable fatty acids typically have a backbone carbon chain of from about 12 to about 60 carbon atoms, such as myristic acid, palmitic acid, stearic acid, arachic acid, montanic acid, octadecinic acid, parinric acid, and so forth. Suitable esters include fatty acid esters, fatty alcohol esters, wax esters, glycerol esters, glycol esters and complex esters. Fatty acid amides include fatty primary amides, fatty secondary amides, methylene and ethylene bisamides and alkanolamides such as, for example, palmitic acid amide, stearic acid amide, oleic acid amide, N,N'-ethylenebisstearamide and so forth. Also suitable are the metal salts of fatty acids such as calcium stearate, zinc stearate, magnesium stearate, and so forth; hydrocarbon waxes, including paraffin waxes, polyolefin and oxidized polyolefin waxes, and microcrystalline waxes. Particularly suitable lubricants are acids, salts, or amides of stearic acid, such as pentaerythritol tetrastearate, calcium stearate, or N,N'-ethylenebisstearamide. When employed, the lubricant(s) typically constitute from about 0.05 wt. % to about 1.5 wt. %, and in some embodiments, from about 0.1 wt. % to about 0.5 wt. % (by weight) of the polymer composition.

IV. Formation

Figure 3:
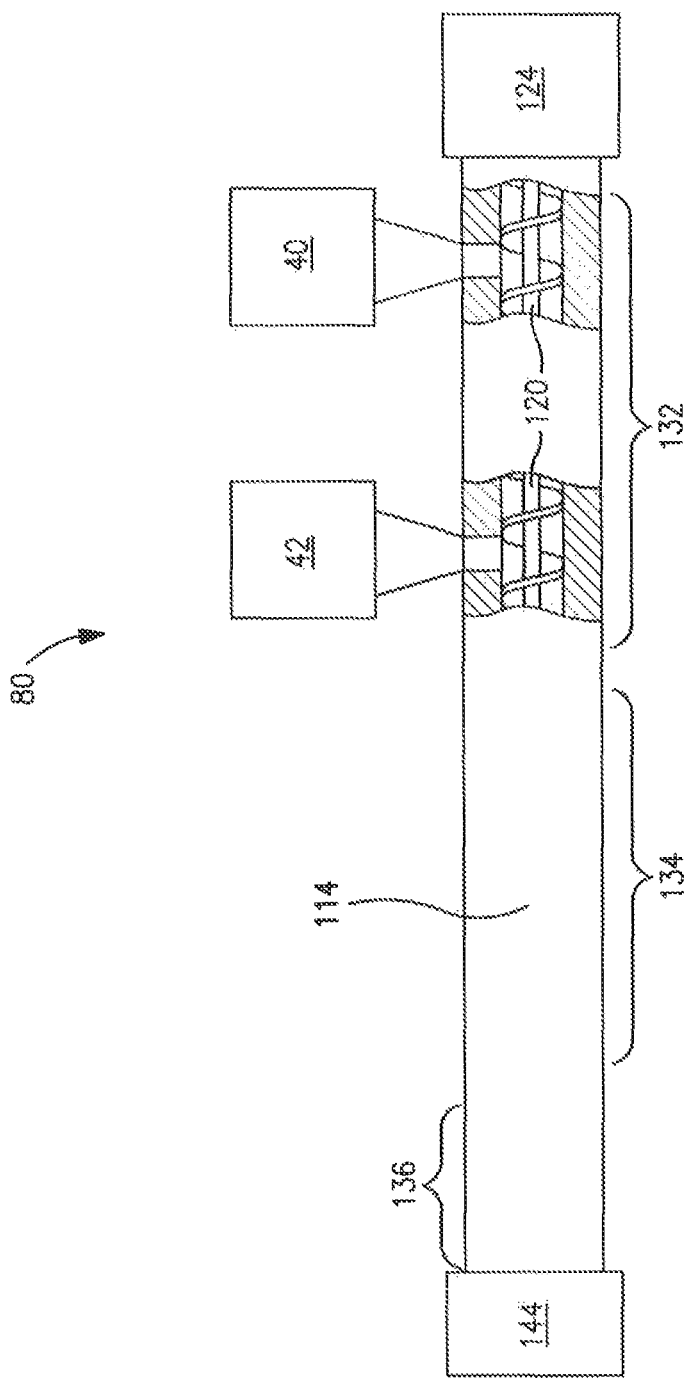
FIG. 3 is a schematic illustration of one embodiment of an extruder screw that may be used to form the polymer composition of the present invention.

The liquid crystalline polymer, carbon fibers, and other optional additives may be melt processed or blended together within a temperature range of from about 250° C. to about 450° C., in some embodiments, from about 280° C. to about 400° C., and in some embodiments, from about 300° C. to about 380° C. to form the polymer composition. Any of a variety of melt processing techniques may generally be employed in the present invention. For example, the components (e.g., liquid crystalline polymer, carbon fibers, etc.) may be supplied to an extruder that includes at least one screw rotatably mounted and received within a barrel (e.g., cylindrical barrel) and may define a feed section and a melting section located downstream from the feed section along the length of the screw. The extruder may be a single screw or twin screw extruder. Referring to FIG. 3, for example, one embodiment of a single screw extruder 80 is shown that contains a housing or barrel 114 and a screw 120 rotatably driven on one end by a suitable drive 124 (typically including a motor and gearbox). If desired, a twin-screw extruder may be employed that contains two separate screws. The configuration of the screw is not particularly critical to the present invention and it may contain any number and/or orientation of threads and channels as is known in the art. As shown in FIG. 3, for example, the screw 120 contains a thread that forms a generally helical channel radially extending around a core of the screw 120. A hopper 40 is located adjacent to the drive 124 for supplying the liquid crystalline polymer and/or other materials (e.g., fillers and/or functional compound) through an opening in the barrel 114. Opposite the drive 124 is the output end 144 of the extruder 80, where extruded plastic is output for further processing.

A feed section 132 and melt section 134 are defined along the length of the screw 120. The feed section 132 is the input portion of the barrel 114 where the liquid crystalline polymer is added. The melt section 134 is the phase change section in which the liquid crystalline polymer is changed from a solid to a liquid. While there is no precisely defined delineation of these sections when the extruder is manufactured, it is well within the ordinary skill of those in this art to reliably identify the feed section 132 and the melt section 134 in which phase change from solid to liquid is occurring. Although not necessarily required, the extruder 80 may also have a mixing section 136 that is located adjacent to the output end of the barrel 114 and downstream from the melt section 134. If desired, one or more distributive and/or dispersive mixing elements may be employed within the mixing and/or melting sections of the extruder. Suitable distributive mixers for single screw extruders may include, for instance, Saxon, Dulmage, Cavity Transfer mixers, etc. Likewise, suitable dispersive mixers may include Blister ring, Leroy/Maddock, CRD mixers, etc. As is well known in the art, the mixing may be further improved by using pins in the barrel that create a folding and reorientation of the polymer melt, such as those used in Buss Kneader extruders, Cavity Transfer mixers, and Vortex Intermeshing Pin mixers.

The carbon fibers are generally added to the extruded at a location downstream from the point at which the liquid crystalline polymer is supplied (e.g., hopper 42). For example, the carbon fibers may be supplied to the melt section 134 and/or to the mixing section 136 of the extruder 80. A hopper 42, for instance, may be located within a zone of the melt section 134 for receiving the carbon fibers. By supplying the carbon fibers at a location where the liquid crystalline polymer is in a molten state, the present inventor has discovered that the polymer is less likely to abrade the fibers and reduce its fiber length. To help control the degree to which the length reduction of the fibers is minimized during extrusion, a variety of different parameters may also be selectively controlled. For example, the ratio of the length ("L") to diameter ("D") of the screw may be selected to achieve an optimum balance between throughput and fiber length reduction. The L/D value may, for instance, range from about 15 to about 55, in some embodiments from about 20 to about 50, and in some embodiments from about 25 to about 45. The length of the screw may, for instance, range from about 0.1 to about 5 meters, in some embodiments from about 0.4 to about 4 meters, and in some embodiments, from about 0.5 to about 2 meters. The diameter of the screw may likewise be from about 5 to about 150 millimeters, in some embodiments from about 10 to about 120 millimeters, and in some embodiments, from about 20 to about 80 millimeters. Perhaps even more important than the total L/D ratio of the screw is the L/D ratio of the screw before the point at which the fibers are supplied. More particularly, the screw has a melting length ("$L_B$") that is defined as the length from the point at which the liquid crystalline polymer is supplied to the extruder to the point at which the carbon fibers are supplied to the extruder, the melting length being less than the total length of the screw. As noted above, it may be desirable to add the fibers after the liquid crystalline polymer begins to or is melted, which means that the $L_B/D$ ratio would be relatively high. However, too high of a $L_B/D$ ratio could result in adequate mixing with the polymer. Therefore, the $L_B/D$ ratio of the screw is typically from about 1 to about 10, in some embodiments from about 2 to about 8, and in some embodiments, from about 3 to about 6.

In addition to the length and diameter, other aspects of the extruder may also be selected to achieve the desired fiber length. For example, the speed of the screw may be selected to achieve the desired residence time, shear rate, melt processing temperature, etc. Generally, an increase in frictional energy results from the shear exerted by the turning screw on the materials within the extruder and results in the fracturing of the fibers. The degree of fracturing may depend, at least in part, on the screw speed. For example, the screw speed may range from about 50 to about 200 revolutions per minute ("rpm"), in some embodiments from about 70 to about 150 rpm, and in some embodiments, from about 80 to about 120 rpm. The apparent shear rate during melt blending may also range from about 100 seconds$^{-1}$ to about 10,000 seconds$^{-1}$, in some embodiments from about 500 seconds$^{-1}$ to about 5000 seconds$^{-1}$, and in some embodiments, from about 800 seconds$^{-1}$ to about 1200 seconds$^{-1}$. The apparent shear rate is equal to $4Q/\pi R^3$, where Q is the volumetric flow rate ("m$^3$/s") of the polymer melt and R is the radius ("m") of the capillary (e.g., extruder die) through which the melted polymer flows.

In the embodiments described above, the length reduction of the fibers is minimized within the extruder. It should be understood, however, that this is by no means a requirement of the present invention. For example, the fibers may simply be supplied to the extruder at a length much greater than what is desired in the final composition. In such embodiments, the fibers may, for example, be supplied at the feed section in conjunction with the liquid crystalline polymer so that it abrades the fibers and reduces their length to the desired value.

Regardless of the particular manner in which it is formed, the present inventor has discovered that the resulting polymer composition can possess excellent thermal properties. For example, the melt viscosity of the polymer composition may be low enough so that it can readily flow into the cavity of a mold having small dimensions. In one particular embodiment, the polymer composition may have a melt viscosity of from about 0.1 to about 80 Pa-s, in some embodiments from about 0.5 to about 50 Pa-s, and in some embodiments, from about 1 to about 30 Pa-s, determined at a shear rate of 1000 seconds$^{-1}$. Melt viscosity may be determined in accordance with ISO Test No. 11443 at a temperature that is 15° C. higher than the melting temperature of the composition (e.g., 350° C.). The composition may also have a relatively high melting temperature. For example, the melting temperature of the polymer may be from about 250° C. to about 400° C., in some embodiments from about 280° C. to about 395° C., and in some embodiments, from about 300° C. to about 380° C.

V. Molded Parts

Once formed, the polymer composition may be molded into any of a variety of different shaped parts using techniques as is known in the art. For example, the shaped parts may be molded using a one-component injection molding process in which dried and preheated plastic granules are injected into the mold. Regardless of the molding technique employed, it has been discovered that the polymer composition of the present invention, which possesses the unique combination of good antistatic properties, high flowability and good mechanical properties, is particularly well suited for electronic parts having a small dimensional tolerance. Such parts, for example, generally contain at least one micro-sized dimension (e.g., thickness, width, height, etc.), such as from about 500 micrometers or less, in some embodiments from about 50 to about 450 micrometers, and in some embodiments, from about 100 to about 400 micrometers.

One such part is a fine pitch electrical connector. More particularly, such electrical connectors are often employed to detachably mount a central processing unit ("CPU") to a printed circuit board. The connector may contain insertion passageways that are configured to receive contact pins. These passageways are defined by opposing walls, which may be formed from a thermoplastic resin. To help accomplish the desired electrical performance, the pitch of these pins is generally small to accommodate a large number of contact pins required within a given space. This, in turn, requires that the pitch of the pin insertion passageways and the width of opposing walls that partition those passageways are also small. For example, the walls may have a width of from about 500 micrometers or less, in some embodiments from about 50 to about 450 micrometers, and in some embodiments, from about 100 to about 400 micrometers. In the past, it has often been difficult to adequately fill a mold of such a thin width with a thermoplastic resin. Due to its unique properties, however, the polymer composition of the present invention is particularly well suited to form the walls of a fine pitch connector.

One particularly suitable fine pitch electrical connector is shown in FIG. 1. An electrical connector 200 is shown that a board-side portion C2 that can be mounted onto the surface of a circuit board P. The connector 200 may also include a wiring material-side portion C1 structured to connect discrete wires 3 to the circuit board P by being coupled to the board-side connector C2. The board-side portion C2 may include a first housing 10 that has a fitting recess 10a into which the wiring material-side connector C1 is fitted and a configuration that is slim and long in the widthwise direction of the housing 10. The wiring material-side portion C1 may likewise include a second housing 20 that is slim and long in the widthwise direction of the housing 20. In the second housing 20, a plurality of terminal-receiving cavities 22 may be provided in parallel in the widthwise direction so as to create a two-tier array including upper and lower terminal-receiving cavities 22. A terminal 5, which is mounted to the distal end of a discrete wire 3, may be received within each of the terminal-receiving cavities 22. If desired, locking portions 28 (engaging portions) may also be provided on the housing 20 that correspond to a connection member (not shown) on the board-side connector C2.

Figure 2:
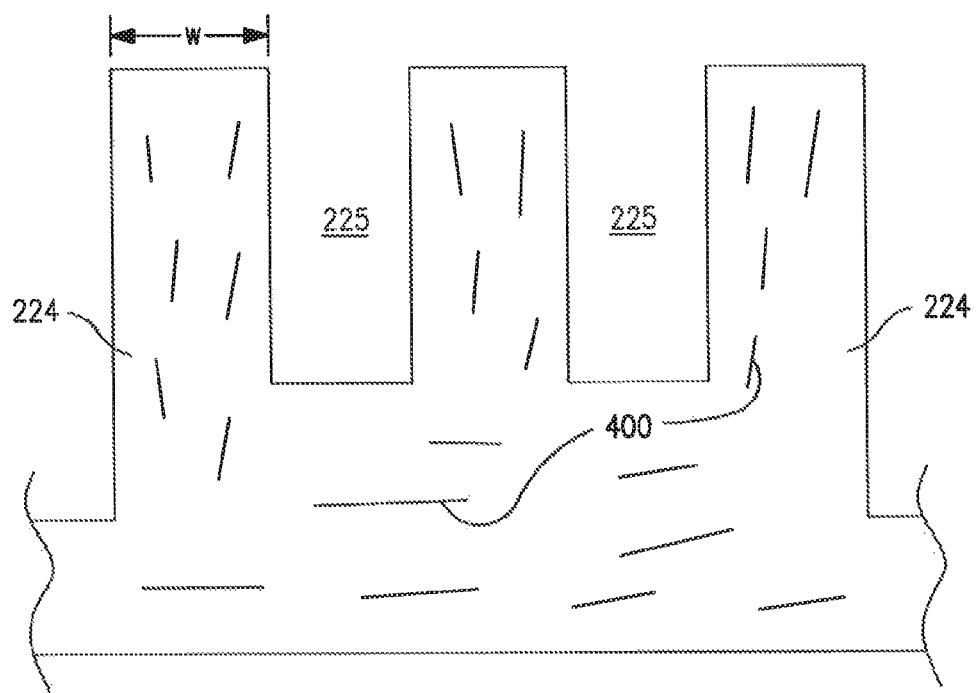
FIG. 2 is a front view of opposing walls of the fine pitch electrical connector of FIG. 1.

As discussed above, the interior walls of the first housing 10 and/or second housing 20 may have a relatively small width dimension, and can be formed from the polymer composition of the present invention. The walls are, for example, shown in more detail in FIG. 2. As illustrated, insertion passageways or spaces 225 are defined between opposing walls 224 that can accommodate contact pins. The walls 224 have a width "w" that is within the ranges noted above. As shown, the walls 224 may contain carbon fibers 400 that are consistently distributed within the liquid crystalline polymer matrix.

In addition to or in lieu of the walls, it should also be understood that any other portion of the housing may also be formed from the polymer composition of the present invention. For example, the connector may also include a shield that encloses the housing. Some or all of the shield may be formed from the polymer composition of the present invention. For example, the housing and the shield can each be a one-piece structure unitarily molded from the polymer composition. Likewise, the shield can be a two-piece structure that includes a first shell and a second shell, each of which may be formed from the polymer composition of the present invention.

Of course, the polymer composition may also be used in a wide variety of other components. For example, the polymer composition may be molded into a planar substrate for use in an electronic component. The substrate may be thin, such as having a thickness of about 500 micrometers or less, in some embodiments from about 50 to about 450 micrometers, and in some embodiments, from about 100 to about 400 micrometers. In one embodiment, for example, the planar substrate may be applied with one or more conductive elements using a variety of known techniques (e.g., laser direct structuring, electroplating, etc.). The conductive elements may serve a variety of different purposes. In one embodiment, for example, the conductive elements form an integrated circuit, such as those used in SIM cards. In another embodiment, the conductive elements form antennas of a variety of different types, such as antennae with resonating elements that are formed from patch antenna structures, inverted-F antenna structures, closed and open slot antenna structures, loop antenna structures, monopoles, dipoles, planar inverted-F antenna structures, hybrids of these designs, etc. The resulting antenna structures may be incorporated into the housing of a relatively compact portable electronic component, such as described above, in which the available interior space is relatively small.

Figure 4:
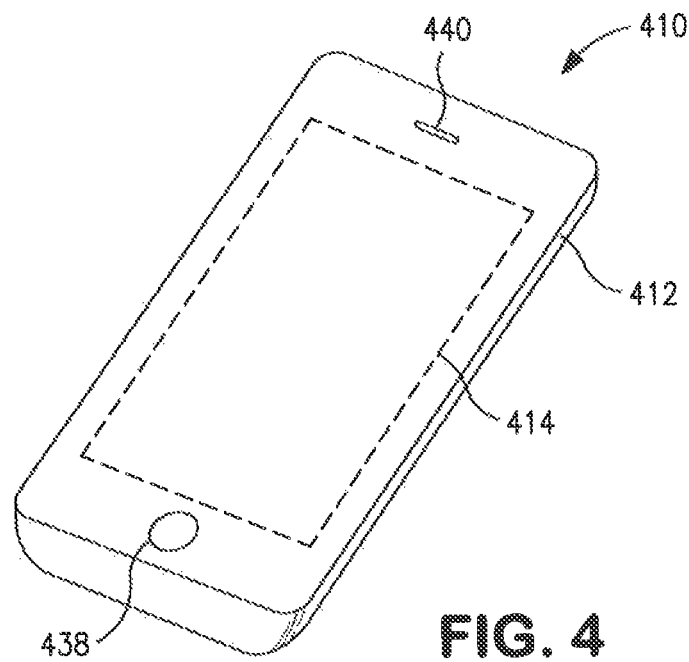
FIGS. 4-5 are respective front and rear perspective views of an electronic component that can employ an antenna structure formed in accordance with one embodiment of the present invention.
Figure 5:
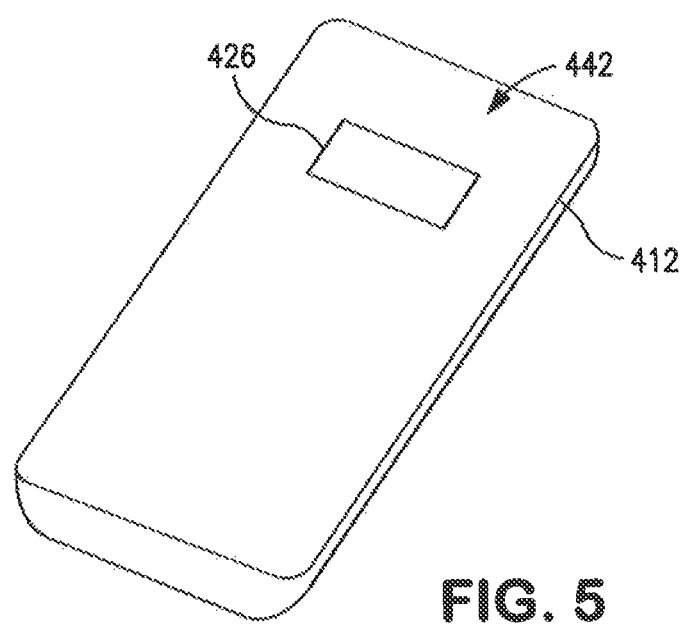

One particularly suitable electronic component that includes an antenna structure is shown in FIGS. 4-5 is a handheld device 410 with cellular telephone capabilities. As shown in FIG. 4, the device 410 may have a housing 412 formed from plastic, metal, other suitable dielectric materials, other suitable conductive materials, or combinations of such materials. A display 414 may be provided on a front surface of the device 410, such as a touch screen display. The device 410 may also have a speaker port 440 and other input-output ports. One or more buttons 438 and other user input devices may be used to gather user input. As shown in FIG. 5, an antenna structure 426 is also provided on a rear surface 442 of device 410, although it should be understood that the antenna structure can generally be positioned at any desired location of the device. As indicated above, the antenna structure 426 may contain a planar substrate that is formed from the polymer composition of the present invention. The antenna structure may be electrically connected to other components within the electronic device using any of a variety of known techniques. For example, the housing 412 or a part of housing 412 may serve as a conductive ground plane for the antenna structure 426.

Figure 6:
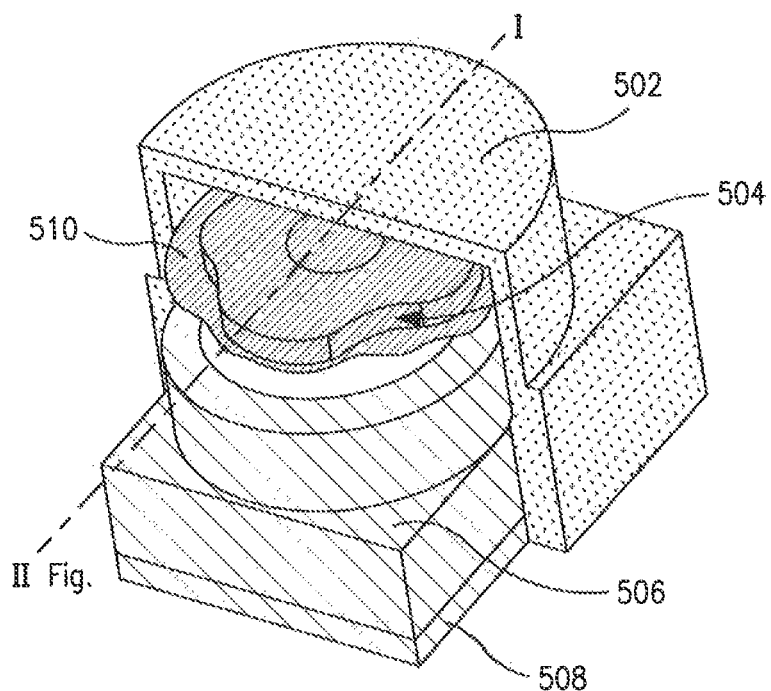
FIGS. 6-7 are perspective and front views of a compact camera module ("CCM") that may be formed in accordance with one embodiment of the present invention.
Figure 7:
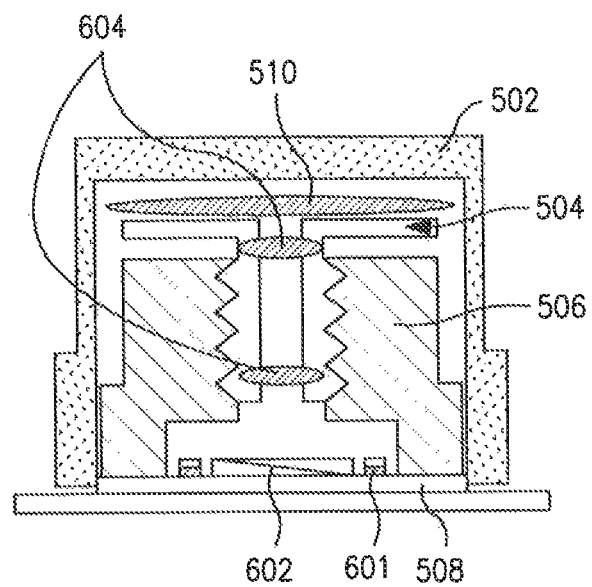

A planar substrate that is formed form the polymer composition of the present invention may also be employed in other applications. For example, in one embodiment, the planar substrate may be used to form a base of a compact camera module ("CCM"), which is commonly employed in wireless communication devices (e.g., cellular phone). Referring to FIGS. 6-7, for example, one particular embodiment of a compact camera module 500 is shown in more detail. As shown, the compact camera module 500 contains a lens assembly 504 that overlies a base 506. The base 506, in turn, overlies an optional main board 508. Due to their relatively thin nature, the base 506 and/or main board 508 are particularly suited to be formed from the polymer composition of the present invention as described above. The lens assembly 504 may have any of a variety of configurations as is known in the art, and may include fixed focus-type lenses and/or auto focus-type lenses. In one embodiment, for example, the lens assembly 504 is in the form of a hollow barrel that houses lenses 604, which are in communication with an image sensor 602 positioned on the main board 508 and controlled by a circuit 601. The barrel may have any of a variety of shapes, such as rectangular, cylindrical, etc. In certain embodiments, the barrel may also be formed from the polymer composition of the present invention and have a wall thickness within the ranges noted above. It should be understood that other parts of the camera module may also be formed from the polymer composition of the present invention. For example, as shown, a polymer film 510 (e.g., polyester film) and/or thermal insulating cap 502 may cover the lens assembly 504. In some embodiments, the film 510 and/or cap 502 may also be formed from the polymer composition of the present invention.

Yet other possible electronic components that may employ the polymer composition include, for instance, cellular telephones, laptop computers, small portable computers (e.g., ultraportable computers, netbook computers, and tablet computers), wrist-watch devices, pendant devices, headphone and earpiece devices, media players with wireless communications capabilities, handheld computers (also sometimes called personal digital assistants), remote controllers, global positioning system (GPS) devices, handheld gaming devices, battery covers, speakers, camera modules, integrated circuits (e.g., SIM cards), housings for electronic devices, electrical controls, circuit breakers, switches, power electronics, printer parts, etc.

Regardless of the particular manner in which it is employed, the present inventor has discovered that a molded part formed from the polymer composition of the present invention can have excellent mechanical and thermal properties. As indicated above, this is due in part to the unique ability of the carbon fibers to be uniformly blended and dispersed within the liquid crystalline polymer matrix. The molded part may, for instance, possess a relatively high impact strength (Charpy notched impact strength), such as about 1 kJ/m$^2$ or more, in some embodiments from about 1.5 to about 40 kJ/m$^2$, and in some embodiments, from about 2 to about 30 kJ/m$^2$, measured at 23° C. according to ISO Test No. 179-1) (technically equivalent to ASTM D256, Method B). The tensile and flexural mechanical properties of the part may also be good. For example, the part may exhibit a tensile strength of from about 20 to about 500 MPa, in some embodiments from about 50 to about 400 MPa, and in some embodiments, from about 70 to about 350 MPa; a tensile break strain of about 0.4% or more, in some embodiments from about 0.5% to about 20%, and in some embodiments, from about 0.6% to about 3.5%; and/or a tensile modulus of from about 5,000 MPa to about 30,000 MPa, in some embodiments from about 8,000 MPa to about 20,000 MPa, and in some embodiments, from about 12,000 MPa to about 18,000 MPa. The tensile properties may be determined in accordance with ISO Test No. 527 (technically equivalent to ASTM D638) at 23° C. The molded part may also exhibit a flexural strength of from about 20 to about 500 MPa, in some embodiments from about 50 to about 400 MPa, and in some embodiments, from about 100 to about 350 MPa; a flexural break strain of about 0.5% or more, in some embodiments from about 0.6% to about 20%, and in some embodiments, from about 0.8% to about 3.5%; and/or a flexural modulus of from about 5,000 MPa to about 30,000 MPa, in some embodiments from about 8,000 MPa to about 20,000 MPa, and in some embodiments, from about 12,000 MPa to about 18,000 MPa. The flexural properties may be determined in accordance with ISO Test No. 178 (technically equivalent to ASTM D790) at 23° C. The molded part may also exhibit a deflection temperature under load (DTUL) of about 200° C. or more, and in some embodiments, from about 220° C. to about 280° C., as measured according to ASTM D648-07 (technically equivalent to ISO Test No. 75-2) at a specified load of 1.8 MPa.

The molded part may also possess improved flame resistance performance, even in the absence of conventional flame retardants. The flame resistance of the composition may, for instance, be determined in accordance the procedure of Underwriter's Laboratory Bulletin 94 entitled "Tests for Flammability of Plastic Materials, UL94." Several ratings can be applied based on the time to extinguish (total flame time) and ability to resist dripping as described in more detail below. According to this procedure, for example, a molded part formed from the composition of the present invention may achieve a V0 rating, which means that the part has a total flame time of 50 seconds or less and a total number of drips of burning particles that ignite cotton of 0, determined at a given part thickness (e.g., 0.25 or 0.8 mm). For example, when exposed to an open flame, a molded part formed from the composition of the present invention may exhibit a total flame time of about 50 seconds or less, in some embodiments about 45 seconds or less, and in some embodiments, from about 1 to about 40 seconds. Furthermore, the total number of drips of burning particles produced during the UL94 test may be 3 or less, in some embodiments 2 or less, and in some embodiments, 1 or less (e.g., 0). Such testing may be performed after conditioning for 48 hours at 23° C. and 50% relative humidity.

The present invention may be better understood with reference to the following examples.

Test Methods

Dielectric Constant ("Dk") and Dissipation Factor ("Df"):

The dielectric constant (or relative static permittivity) and dissipation factor may be determined using a known split-post dielectric resonator technique, such as described in Baker-Jarvis, et al., *IEEE Trans, on Dielectric and Electrical Insulation*, 5(4), p. 571 (1998) and Krupka, et al., *Proc. 7th International Conference on Dielectric Materials: Measurements and Applications, IEEE Conference Publication No.* 430 (September 1996). More particularly, a plaque sample having a size of 80 mm×80 mm×1 mm may be inserted between two fixed dielectric resonators. The resonator measures the permittivity component in the plane of the specimen. Five (5) samples may be tested and the average value is recorded. The split-post resonator can be used to make dielectric measurements in different frequency regions, such as at 10 MHz.

Surface/Volume Resistivity.

The surface and volume resistivity values are generally determined in accordance with IEC 60093 (similar to ASTM D257-07). According to this procedure, a standard specimen (e.g., 1 meter cube) is placed between two electrodes. A voltage is applied for sixty (60) seconds and the resistance is measured. The surface resistivity is the quotient of the potential gradient (in V/m) and the current per unit of electrode length (in A/m), and generally represents the resistance to leakage current along the surface of an insulating material. Because the four (4) ends of the electrodes define a square, the lengths in the quotient cancel and surface resistivities are reported in ohms, although it is also common to see the more descriptive unit of ohms per square. Volume resistivity is also determined as the ratio of the potential gradient parallel to the current in a material to the current density. In SI units, volume resistivity is numerically equal to the direct-current resistance between opposite faces of a one-meter cube of the material (ohm-m).

Melt Viscosity:

The melt viscosity (Pa-s) may be determined in accordance with ISO Test No. 11443 at a shear rate of 1000 s$^{-1}$ and temperature 15° C. above the melting temperature (e.g., 350° C.) using a Dynisco LCR7001 capillary rheometer. The rheometer orifice (die) had a diameter of 1 mm, length of 20 mm, L/D ratio of 20.1, and an entrance angle of 180°. The diameter of the barrel was 9.55 mm+0.005 mm and the length of the rod was 233.4 mm.

Melting Temperature:

The melting temperature ("Tm") was determined by differential scanning calorimetry ("DSC") as is known in the art. The melting temperature is the differential scanning calorimetry (DSC) peak melt temperature as determined by ISO Test No. 11357. Under the DSC procedure, samples were heated and cooled at 20° C. per minute as stated in ISO Standard 10350 using DSC measurements conducted on a TA Q2000 Instrument.

Fiber Length:

The volume average fiber length is determined by initially placing several pellet samples (e.g., 7 or 8) in a muffle furnace at 420° C. overnight. The resulting ash is immersed in an aqueous solution containing a glycerol surfactant to disperse the fibers. The aqueous solution is then placed on a glass slide and images are collected via image analysis system. Fibers are selectively chosen from the images by ImagePro™ software, and the software automatically measures the length of the selected fiber based on calibrated length. Measurement continues until at least 500 fibers are counted. Then, the volume average fiber length and distribution are calculated.

Deflection Temperature Under Load ("DTUL"):

The deflection under load temperature was determined in accordance with ISO Test No, 75-2 (technically equivalent to ASTM D648-07). More particularly, a test strip sample having a length of 80 mm, thickness of 10 mm, and width of 4 mm was subjected to an edgewise three-point bending test in which the specified load (maximum outer fibers stress) was 1.8 Megapascals. The specimen was lowered into a silicone oil bath where the temperature is raised at 2° C. per minute until it deflects 0.25 mm (0.32 mm for ISO Test No. 75-2).

Tensile Modulus, Tensile Stress, and Tensile Elongation:

Tensile properties are tested according to ISO Test No. 527 (technically equivalent to ASTM D638). Modulus and strength measurements are made on the same test strip sample having a length of 80 mm, thickness of 10 mm, and width of 4 mm. The testing temperature is 23° C., and the testing speeds are 1 or 5 mm/min.

Flexural Modulus, Flexural Stress, and Flexural Strain:

Flexural properties are tested according to ISO Test No. 178 (technically equivalent to ASTM D790). This test is performed on a 64 mm support span. Tests are run on the center portions of uncut ISO 3167 multi-purpose bars. The testing temperature is 23° C. and the testing speed is 2 mm/min.

Notched Charpy Impact Strength:

Notched Charpy properties are tested according to ISO Test No. ISO 179-1) (technically equivalent to ASTM D256, Method B). This test is run using a Type A notch (0.25 mm base radius) and Type 1 specimen size (length of 80 mm, width of 10 mm, and thickness of 4 mm). Specimens are cut from the center of a multi-purpose bar using a single tooth milling machine. The testing temperature is 23° C.

Antistatic Test:

To test for antistatic behavior, molded disks/plaques may be gently rubbed against paper to create an electrostatic charge on the molded part surface. The parts may then be brought near the small pieces of papers. If an electrostatic charge is created on the part surface, an attractive force between the part and the paper may be created. Likewise, if there is no electrostatic charge created, no movement for the paper occurs as the part is moved closer to the paper. If there is movement in the paper, it is recorded as "no:" and if there is no movement in the paper, then it is recorded as "yes."

UL94:

A specimen is supported in a vertical position and a flame is applied to the bottom of the specimen. The flame is applied for ten (10) seconds and then removed until flaming stops, at which time the flame is reapplied for another ten (10) seconds and then removed. Two (2) sets of five (5) specimens are tested. The sample size is a length of 125 mm, width of 13 mm, and thickness of 0.8 mm. The two sets are conditioned before and after aging. For unaged testing, each thickness is tested after conditioning for 48 hours at 23° C. and 50% relative humidity. For aged testing, five (5) samples of each thickness are tested after conditioning for 7 days at 70° C.

| Vertical Ratings | Requirements |
|---|---|
| V-0 | Specimens must not burn with flaming combustion for more than 10 seconds after either test flame application. Total flaming combustion time must not exceed 50 seconds for each set of 5 specimens. Specimens must not burn with flaming or glowing combustion up to the specimen |

| Vertical Ratings | Requirements |
|---|---|
| | holding clamp. Specimens must not drip flaming particles that ignite the cotton. No specimen can have glowing combustion remain for longer than 30 seconds after removal of the test flame. |
| V-1 | Specimens must not burn with flaming combustion for more than 30 seconds after either test flame application. Total flaming combustion time must not exceed 250 seconds for each set of 5 specimens. Specimens must not burn with flaming or glowing combustion up to the specimen holding clamp. Specimens must not drip flaming particles that ignite the cotton. No specimen can have glowing combustion remain for longer than 60 seconds after removal of the test flame. |
| V-2 | Specimens must not burn with flaming combustion for more than 30 seconds after either test flame application. Total flaming combustion time must not exceed 250 seconds for each set of 5 specimens. Specimens must not burn with flaming or glowing combustion up to the specimen holding clamp. Specimens can drip flaming particles that ignite the cotton. No specimen can have glowing combustion remain for longer than 60 seconds after removal of the test flame. |

Example 1

Two samples (Samples 1-2) are each formed from by blending 20.875 wt. % of a base liquid crystalline polymer, 18 wt. % glass fibers, 18 wt. % talc, 30 wt. % of a carbon fiber masterbatch, 12.5 wt. % of a black color masterbatch, 0.3 wt. % of a lubricant (Glycolube™ P), 0.2 wt. % of aluminum trihydrate ("ATH"), 0.1 wt. % of 4,4'-biphenol ("BP"), and 0.025 wt. % of 2,6-naphthelene dicarboxylic acid ("NDA"). The black masterbatch contains 80 wt. % of a liquid crystalline polymer and 20 wt. % of carbon black. The carbon fiber masterbatch contains 30 wt. % carbon fibers, 67 wt. % of a liquid crystalline polymer, and 3 wt. % of the black color masterbatch. The base liquid crystalline polymer, as well as the liquid crystalline polymers in the black and carbon fiber masterbatches, are formed from HBA, HNA, TA, BP, and APAP, such as described in U.S. Pat. No. 5,508,374 to Lee, et al.

In Sample 1, the carbon fibers were PAN based and sold under the tradename PANEX PX35 which have an initial length of 6 mm, an average diameter of 7.2 micrometers, a density of 1.81 g/cm$^3$ and a carbon content of 95 wt. %. In Sample 2, the carbon fibers used are sold under the tradename SIGRAFIL C30. These carbon fibers are also PAN based and include an aromatic polymer sizing agent. The fibers have an original length of 3 mm.

The base liquid crystalline polymer, black masterbatch, lubricant, ATH, BP, and NDA are all supplied to the feed throat of a ZSK-25 WLE co-rotating, fully intermeshing twin screw extruder having a total mixing element L/D ratio of 7.5. Glass fiber and talc were fed at barrel 4 and barrel 6, respectively, by means of a volumetric feeder. The extruder has Temperature Zones 1-9, which may be set to the following temperatures: 330° C., 330° C., 310° C., 310° C., 310° C., 310° C., 320° C., 320° C., and 320° C., respectively. The screw design is selected so that melting occurs after Zone 4. The polymer is supplied to the feed throat by means of a volumetric feeder. In Sample 1, the carbon fiber masterbatch is also supplied to the feed throat. In Sample 2, the carbon fibers are fed to Barrel 6 as indicated in Table 1 below. Carbon fiber length and distribution in pellets obtained from the polymer composition are as follows:

TABLE 1

| | Sample 1 | Sample 2 |
|---|---|---|
| L/D after carbon fiber feeding | 7.5 | 3.5 |
| $L_B$/D before carbon fiber feeding ("Melting Length") | 0.0 | 4.0 |
| Carbon Fiber Length Distribution | | |
| Vol. Average (μm) | 0.15 | 0.15 |
| Vol. Standard Deviation | 0.07 | 0.07 |
| Max | 0.4 | 0.5 |
| Count | 1289 | 1177 |
| Coefficient of Variance (%) | 51.8 | 52.6 |

Once melt blended, the samples are extruded through a single-hole strand die, cooled through a water bath, and pelletized. Parts are injection molded from the samples into plaques (60 mm×60 mm) and tested for resistivity (surface and volume), mechanical properties, and thermal properties. The results are set forth below in Table 2,

TABLE 2

| | Sample 1 | Sample 2 |
|---|---|---|
| Surface Resistivity (ohm) | $1.3 \times 10^{15}$ | $1.6 \times 10^5$ |
| Volume Resistivity (ohm-m) | $8.0 \times 10^{14}$ | $1.3 \times 10^4$ |
| Melt Viscosity (Pa-s) (1000 s$^{-1}$ @ 350° C.) | 21 | 23 |
| Melt Viscosity (Pa-s) (400 s$^{-1}$ @ 350° C.) | 31 | 35 |
| Melt Temp (° C.) | 333 | 333 |
| DTUL @ 1.8 Mpa (° C.) | 237 | 242 |
| Charpy Notched (kJ/m$^2$) | 3.3 | 3.0 |
| Tensile Strength (MPa) | 76 | 80 |
| Tensile Modulus (MPa) | 14,367 | 16,091 |
| Tensile Strain at Break (%) | 0.85 | 0.67 |
| Flexural Strength (MPa) | 123 | 124 |
| Flexural Modulus (MPa) | 15,059 | 15,799 |
| Flexural Strain at Break (%) | 1.24 | 1.11 |

As indicated, the downstream application of the carbon fibers generally resulted in a decrease in surface and resistivity, but without a substantial impact on the physical properties of the composition. In fact, surprisingly, many of the mechanical properties are actually improved. It is believed that better conductivity is obtained in Sample 2 in part because the carbon fibers were more uniformly dispersed within the polymer matrix.

Example 2

Four samples (Samples 3-6) are formed by blending a base liquid crystalline polymer, glass fibers, talc, carbon fiber masterbatch, black color masterbatch, lubricant (Glycolube™ P), aluminum trihydrate ("ATH"), 4,4'-biphenol ("BP"), and 2,6-naphthelene dicarboxylic acid ("NDA") in the percentages indicated below in Table 3. The base liquid crystalline polymer and black masterbatch are the same as in Example 1. The carbon fiber masterbatch for Samples 3, 5, and 6 are the same as in Sample 1 of Example 1. The carbon fiber masterbatch for Sample 4 is the same as in Sample 2 of Example 1.

The base liquid crystalline polymer, black masterbatch, lubricant, ATH, BP, and NDA are all supplied to the feed throat of a ZSK-25 WLE co-rotating, fully intermeshing twin screw extruder having a total mixing element L/D ratio of 7.5. Glass fiber and talc are fed at barrel 4 and barrel 6, respectively, by means of a volumetric feeder. The extruder has Temperature Zones 1-9, which may be set to the following temperatures: 330° C., 330° C., 310° C., 310° C., 310° C., 310° C., 320° C., 320° C., and 320° C., respectively. The screw design is selected so that melting occurs after Zone 4. The polymer is supplied to the feed throat by means of a volumetric feeder. For Samples 3, 4, and 5, the carbon fiber masterbatch is supplied to barrel 6, but for Sample 6, the carbon fiber masterbatch is supplied at the feed throat.

TABLE 3

|  | Sample 3 | Sample 4 | Sample 5 | Sample 6 |
|---|---|---|---|---|
| LCP (wt. %) | 20.88 | 20.88 | 30.88 | 20.88 |
| Glass Fiber (wt. %) | 18.0 | 18.0 | 18.0 | 18.0 |
| Talc (wt. %) | 18.0 | 18.0 | 18.0 | 18.0 |
| Lubricant (wt. %) | 0.3 | 0.3 | 0.3 | 0.3 |
| ATH | 0.2 | 0.2 | 0.2 | 0.2 |
| BP | 0.1 | 0.1 | 0.1 | 0.1 |
| NDA | 0.025 | 0.025 | 0.025 | 0.025 |
| Carbon Fiber Masterbatch | 30.0 | 30.0 | 20.0 | 30.0 |
| Black Masterbatch | 12.5 | 12.5 | 12.5 | 12.5 |

Once melt blended, the samples are extruded through a single-hole strand die, cooled through a water bath, and pelletized. Parts are injection molded from the samples into plaques (60 mm×60 mm) and tested for resistivity (surface and volume), dielectric constant, dissipation factor, mechanical properties, and thermal properties. The results are set forth below in Table 4.

TABLE 4

|  | Sample 3 | Sample 4 | Sample 5 | Sample 6 |
|---|---|---|---|---|
| Surface Resistivity (ohm) | 4.3E+06 | 1.2E+05 | 2.6E+14 | 3.0E+08 |
| Volume Resistivity (ohm-m) | 1.3E+05 | 8.5E+03 | 2.5E+13 | 2.9E+12 |
| Dielectric Constant (at 10 MHz) | 12 | 34 | 8 | 9 |
| Dissipation Factor (at 10 MHz) | 0.216 | 0.711 | 0.099 | 0.095 |
| Melt Viscosity (Pa-s) (1000 s$^{-1}$ @ 350° C.) | 24 | 29 | 31 | 29 |
| Melt Viscosity (Pa-s) (400 s$^{-1}$ @ 350° C.) | 36.8 | 43.4 | 44.8 | 43.2 |
| Melt Temp (° C.) | 330 | 332 | 330 | 332 |
| DTUL @ 1.8 MPa (° C.) | 246.8 | 242.1 | 243.6 | 238.4 |
| Charpy Notched (kJ/m$^2$) | 3 | 3 | 4 | 3 |
| Tensile Strength (MPa) | 102 | 99 | 102 | 91 |
| Tensile Modulus (MPa) | 16,561 | 16,567 | 15,038 | 14,462 |
| Tensile Strain at Break (%) | 1.17 | 1.18 | 1.45 | 1.39 |
| Flexural Strength (MPa) | 153 | 153 | 156 | 137 |
| Flexural Modulus (MPa) | 17,697 | 18,565 | 16,476 | 16,896 |
| Flexural Strain at Break (%) | 1.40 | 1.35 | 1.71 | 1.43 |

These and other modifications and variations of the present invention may be practiced by those of ordinary skill in the art, without departing from the spirit and scope of the present invention. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

What is claimed is:

1. A molded part that comprises a polymer composition, the polymer composition comprising carbon fibers distributed within a liquid crystalline polymer matrix that constitutes from about 25 wt. % to about 95 wt. % of the composition, wherein carbon fibers constitute from about 0.5 wt. % to about 20 wt. % of the composition, and wherein the molded part exhibits a surface resistivity of about $1\times10^{14}$ ohms or less as determined in accordance with IEC 60093, dielectric constant of about 5 or more as determined at a frequency of 10 MHz, and dissipation factor of about 1 or less as determined at a frequency of 10 MHz.

2. The molded part of claim 1, wherein the liquid crystalline polymer matrix is formed from a polymer that contains aromatic ester repeating units that include aromatic dicarboxylic acid repeating units, aromatic hydroxycarboxylic acid repeating units, or a combination thereof.

3. The molded part of claim 2, wherein the polymer further contains aromatic diol repeating units.

4. The molded part of claim 1, wherein the carbon fibers have a carbon content of about 85 wt. % or more.

5. The molded part of claim 1, wherein the carbon fibers have a density of from about 0.5 to about 3.0 g/cm$^3$.

6. The molded part of claim 1, wherein the carbon fibers have an average diameter of from about 0.5 to about 30 micrometers.

7. The molded part of claim 1, further comprising glass fibers, particulate filler, or a combination thereof.

8. The molded part of claim 1, further comprising a functional compound that includes an aromatic diol, aromatic carboxylic acid, hydrate, or a combination thereof.

9. The molded part of claim 1, wherein the carbon fibers comprise a sizing agent, the sizing agent comprising an aromatic polymer.

10. The molded part of claim 8, wherein the aromatic polymer has a thermal decomposition temperature of at least 350° C.

11. A compact camera module comprising the molded part of claim 1.

12. The molded part of claim 1, wherein the carbon fibers and liquid crystalline polymer matrix are melt processed within an extruder, and wherein the carbon fibers are supplied to the extruder at a location downstream from the feed section where the liquid crystalline polymer matrix is supplied.

13. The molded part of claim 1, wherein the molded part exhibits a surface resistivity of from about $1\times10^2$ to about $1\times10^8$ ohms as determined in accordance with IEC 60093, dielectric constant of about 10 or more as determined at a frequency of 10 MHz, and dissipation factor of about 0.5 or less as determined at a frequency of 10 MHz.

* * * * *